(12) United States Patent
Nishio et al.

(10) Patent No.: US 8,795,467 B2
(45) Date of Patent: *Aug. 5, 2014

(54) PLASMA PROCESSING APPARATUS AND METHOD

(75) Inventors: Ryoji Nishio, Kudamatsu (JP); Ken Yoshioka, Hikari (JP); Saburou Kanai, Hikari (JP); Tadamitsu Kanekiyo, Kudamatsu (JP); Hideki Kihara, Kudamatsu (JP); Koji Okuda, Kudamatsu (JP)

(73) Assignee: Hitachi High Technologies Corporation, Tokyo (JP)

( * ) Notice: Subject to any disclaimer, the term of this patent is extended or adjusted under 35 U.S.C. 154(b) by 486 days.

This patent is subject to a terminal disclaimer.

(21) Appl. No.: 12/575,514

(22) Filed: Oct. 8, 2009

(65) Prior Publication Data

US 2010/0018649 A1 Jan. 28, 2010

Related U.S. Application Data

(63) Continuation of application No. 11/779,396, filed on Jul. 18, 2007, now abandoned, which is a continuation of application No. 10/378,628, filed on Mar. 5, 2003, now abandoned.

(51) Int. Cl.
*H01L 21/306* (2006.01)
*C23C 16/00* (2006.01)

(52) U.S. Cl.
USPC ............ 156/345.48; 118/723 IR; 118/723 AN

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 4,718,975 A | 1/1988 | Bowling | |
| 4,918,031 A | 4/1990 | Flamm | |
| 5,646,489 A | 7/1997 | Kakehi | |
| 5,650,032 A | 7/1997 | Keller | |
| 5,681,418 A | 10/1997 | Ishimaru | |
| 6,013,155 A | 1/2000 | McMillin | |
| 6,143,078 A | 11/2000 | Ishikawa | |
| 6,280,563 B1 | 8/2001 | Baldwin | |
| 8,062,473 B2 * | 11/2011 | Nishio et al. | 156/345.48 |
| 2002/0036064 A1 | 3/2002 | DeOrnellas | |
| 2009/0078375 A1 * | 3/2009 | Nishio et al. | 156/345.33 |

FOREIGN PATENT DOCUMENTS

| | | |
|---|---|---|
| JP | 10-275694 | 10/1998 |
| JP | 11-074098 | 3/1999 |
| JP | 2000-323298 | 11/2000 |

* cited by examiner

*Primary Examiner* — Luz Alejandro Mulero
(74) *Attorney, Agent, or Firm* — Antonelli, Terry, Stout & Kraus, LLP.

(57) ABSTRACT

A plasma processing apparatus includes a sample stage disposed at a lower part of a processing chamber, a bell jar made of an insulative material constituting an upper portion of a vacuum vessel, a coil antenna disposed outside and around the bell jar to which electric power is supplied so as to generate the plasma in a plasma generating space inside of the bell jar, and a Faraday shield mounted on the bell jar and disposed between an external surface of the bell jar and the coil antenna. A ring shaped member made of an electric conductive material is disposed inside of an inner surface of a ring portion of the processing chamber located below a skirt portion of the bell jar and constitutes a part of the processing chamber. The ring shaped member extends upwardly so as to cover a portion of an inner surface of the bell jar.

4 Claims, 23 Drawing Sheets

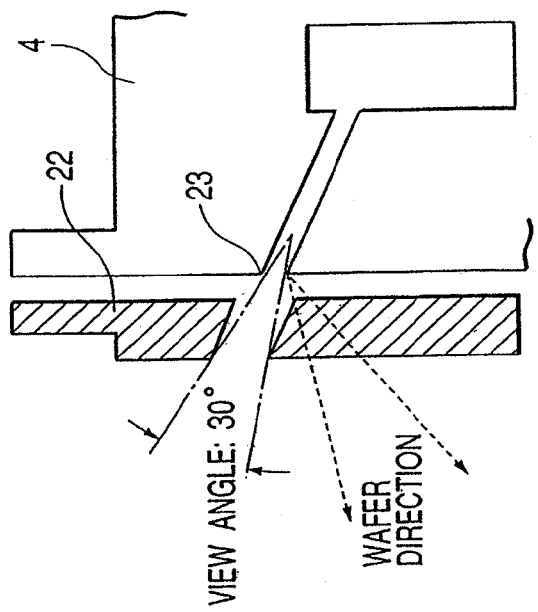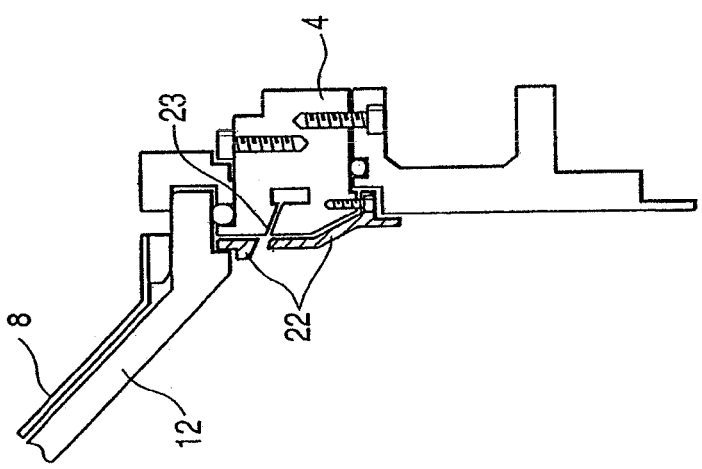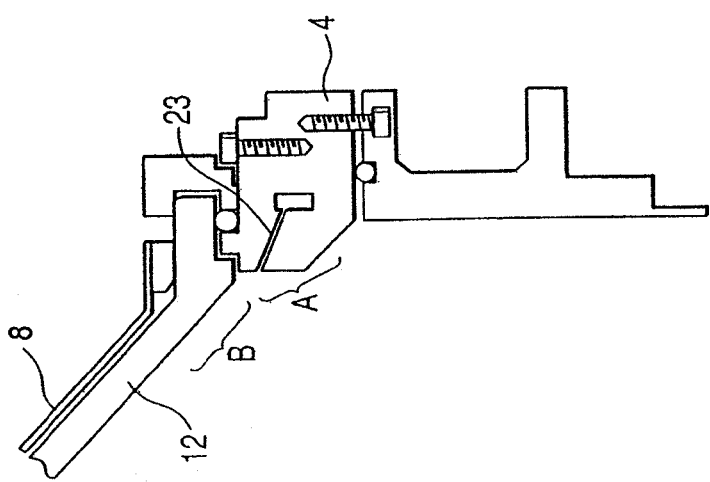

PLASMA PROCESSING APPARATUS AND METHOD

CROSS-REFERENCE TO RELATED APPLICATIONS

This application is a continuation of U.S. application Ser. No. 11/779,396, filed Jul. 18, 2007, now abandoned which is a continuation of U.S. application Ser. No. 10/378,628 filed on Mar. 5, 2003, now abandoned the contents of the aforementioned applications being incorporated herein by reference in their entirety. This application also relates to U.S. Ser. No. 11/001,059, filed Dec. 2, 2004, now U.S. Pat. No. 7,740,739, which is a continuation of U.S. application Ser. No. 10/378,628, filed Mar. 5, 2003, and U.S. application Ser. No. 12/324,125, filed Nov. 26, 2008, now U.S. Pat. No. 8,062,473, which is also a continuation of U.S. application Ser. No. 10/378,628, filed Mar. 5, 2003.

BACKGROUND OF THE INVENTION

The present invention relates to a plasma processing apparatus and a plasma processing method; and, more particularly, it relates to a plasma processing apparatus and a plasma processing method with which it is possible to suppress the occurrence of obstacles caused by reaction products.

Materials to be etched, which are used in the field of semiconductor device production, can include volatile materials, such as Si, Al and $SiO_2$, for example, for a DRAM (Dynamic Random Access Memory) or logic circuit IC. Further, non-volatile materials, such as Fe, have been adopted for a FRAM (Ferroelectric Random Access Memory) or a MRAM (Magnetic Random Access Memory).

The non-volatile materials are difficult to etch since the melting point of the reaction products that are formed during etching is high. Further, since the vapor pressure of the reaction products after etching is low and the deposition coefficient to the inner walls of the vacuum vessels (vacuum processing chamber) is high, the inner walls of the vacuum vessels tend to become covered with deposits of the reaction products, even after processing only a small amount of samples (several to several hundreds of sheets). Further, when they have peeled and fallen, the deposits form obstacles.

When the reaction products are deposited, the coupling state between induction antennas and plasmas in the reactor changes so as to vary, with time, the etching rate or the uniformness thereof, as well as the vertical etching property, the deposition states of the reaction products on the etching side wall, etc.

Since examples of the non-volatile materials include Fe, NiFe, PtMn, and IrMn as ferromagnetic or anti-ferromagnetic materials used for MRMA or magnetic heads, as well as Pt, Ir, Au, Ta, and Ru as noble metal materials used for capacitor portions or gate portions in a DRAM, capacitor portions in a MRAM and TMR (Tunneling Magneto Resistive) elements in a MRAM. In addition, they can also include $Al_2O_3$, $HfO_3$, and $Ta_2O_3$ as highly dielectric materials, and PZT (Lead Titanate Zirconate), BST (Barium Strontium Titanate) and SBT (Strontium Bismuth tantalate).

Further, also in the field of semiconductor device production, a technique of forming Si, $SiO_2$ or SiN films by a plasma CVD method has frequently been adopted in the steps for production of semiconductor devices. According to this technique, a polymerizable gas, such as monosilane, is injected into plasmas to form films on a wafer. In this process, a great amount of polymer films are deposited on the inner wall of a reactor, other than on the wafers, thereby to inhibit the mass production stability. That is, when polymer film is deposited to an excessive thickness on the inner wall of the reactor, the polymer film peels and falls from the surface of the inner wall and adheres on the wafer as obstacles in the same manner as described previously. Accordingly, it is necessary to conduct plasma cleaning by using a violent special gas, such as $NF_3$, or to conduct manual cleaning after opening the reactor.

In addition, in the field of semiconductor device production, a $SiO_2$ plasma dry etching step is used frequently. In the type of etching, a fluoro carbon, such as $C_4F_8$, $C_5F_8$, CO, $CF_4$ and $CHF_3$, is used as an etching gas. Reaction products that are formed by reaction of such gas in the plasmas contain a great amount of free radicals, such as C, CF, $C_2F_2$; and, when the free radicals are deposited on the inner wall of the reactor, they cause obstacles to be created, as in the case described previously. Further, when the free radicals are evaporated again in the plasmas, they change the chemical composition of the plasmas so as to cause the wafer etching rate to vary with time.

An induction type plasma processing apparatus, in which coiled antennas are disposed on the outer circumference of a vacuum vessel, or a plasma processing apparatus in which a microwaves are introduced into the vacuum vessel, have been known as existent plasma processing apparatuses. In any of the processing apparatuses described above, since countermeasures for the preventing formation of deposited matter on the inner wall of the vacuum vessel, in the case of etching a non-volatile material, are not completely effective, a manual cleaning operation, which involves opening the vacuum vessel to the atmosphere, needs to be conducted repeatedly. Since manual cleaning requires as much as 6 to 12 hours from the start of the cleaning to the start of the processing for the next sample, this lowers the operation efficiency of the apparatus.

For example, Japanese Patent Laid-open Nos. 10-275694, 11-74098 and 2000-323298 disclose a plasma processing apparatus in which plasmas are generated by an induction method in a processing vessel, a Faraday shield is formed between induction antennas disposed on the outer circumference of the vacuum vessel and the plasmas, and an RF power source is connected to the Faraday shield to supply electric power, thereby reducing the deposition of reaction products on the inner wall of the vacuum vessel, or enabling cleaning of the inner wall of the vacuum vessel.

This apparatus is effective for the portions of the vacuum vessel that are formed of a non-conductive material, such as ceramics or quartzes and the portions that effective electric fields due to the Faraday shield can reach. However, the apparatus is not effective for other portions that are formed of non-conductive materials or conductive materials.

As has been described above, when reaction products are deposited excessively on the inner wall of the vacuum vessel, deposited films tend to peel and fall from the surface of the inner wall and adhere as obstacles on the wafer. Further, in the plasma processing apparatus using induction antennas, the coupling state between the induction antennas and the plasmas in the reaction vessel is changed so as to vary the etching rate and the uniformness thereof, as well as the vertical etching property, and the deposition state of the reaction products on the etching side wall. Further, when the inner wall of the vacuum vessel is cleaned, since it takes much time until the start of the processing for the next sample, the operation efficiency of the apparatus is lowered. Further, in the plasma processing apparatus in which it is intended to decrease the adhesion of reaction products on the inner wall of the vacuum vessel, or to enable cleaning of the inner wall of the vacuum vessel by providing a Faraday shield between the induction antennas disposed on the outer circumference of the vacuum vessel and the plasmas and connecting the RF power source to the Faraday shield to supply electric power thereto, the range of the desired effect is limited.

SUMMARY OF THE INVENTION

The present invention has been accomplished in view of the foregoing problems, and it is an object of the present invention to provide a plasma processing apparatus which has excellent mass production stability by controlling the deposition of films on the inner wall of a vacuum vessel.

According to one aspect of the present invention, there is provided a plasma processing apparatus which has a gas ring forming a portion of a vacuum processing chamber and having a blowing port for supplying a processing gas; a bell jar covering a portion above the gas ring to define a vacuum processing chamber; an antenna, disposed above the bell jar, for supplying RF electric fields into the vacuum processing chamber to form plasmas; a sample table for supporting a sample in the vacuum processing chamber; a Faraday shield disposed between the antenna and the bell jar and which is supplied with an RF bias voltage; and a deposition preventive plate attached detachably to the inner surface of the gas ring, excluding the blowing port for the processing gas; wherein the area of the inner surface of the gas ring, including the deposition preventive plate, that can be viewed from the sample surface is set to about ½ or more of the area of the sample.

DESCRIPTION OF THE ACCOMPANYING DRAWINGS

Other objects and advantages of the present invention will become apparent from the following description of various embodiments, with reference to the accompanying drawings, in which.

Figure 5A:
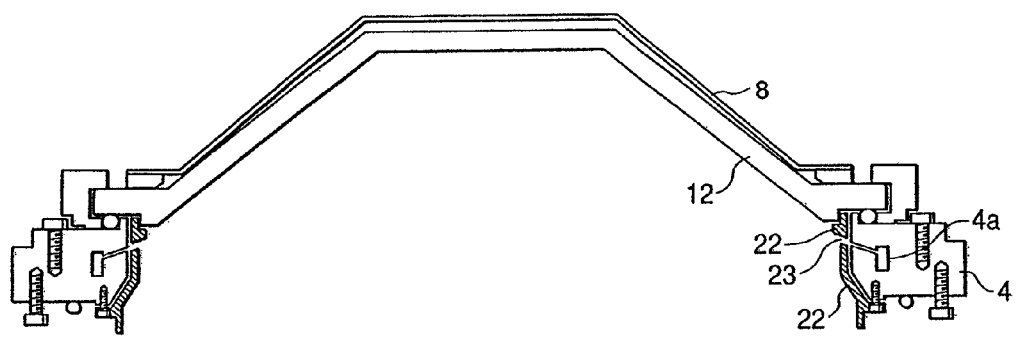
Figure 5B:
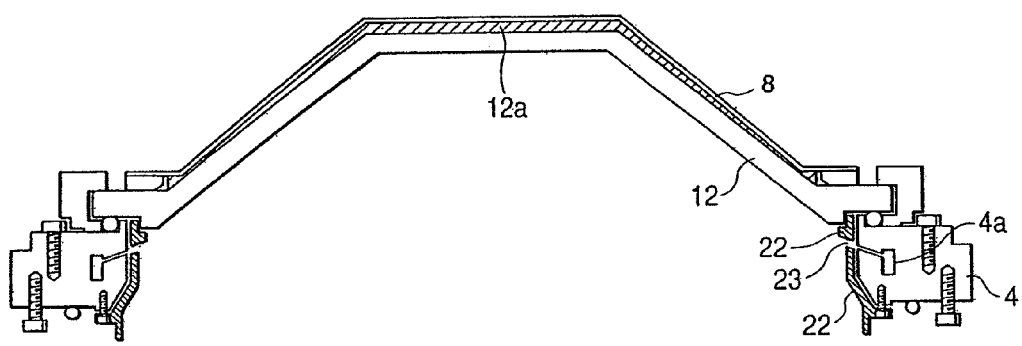
Figure 7:
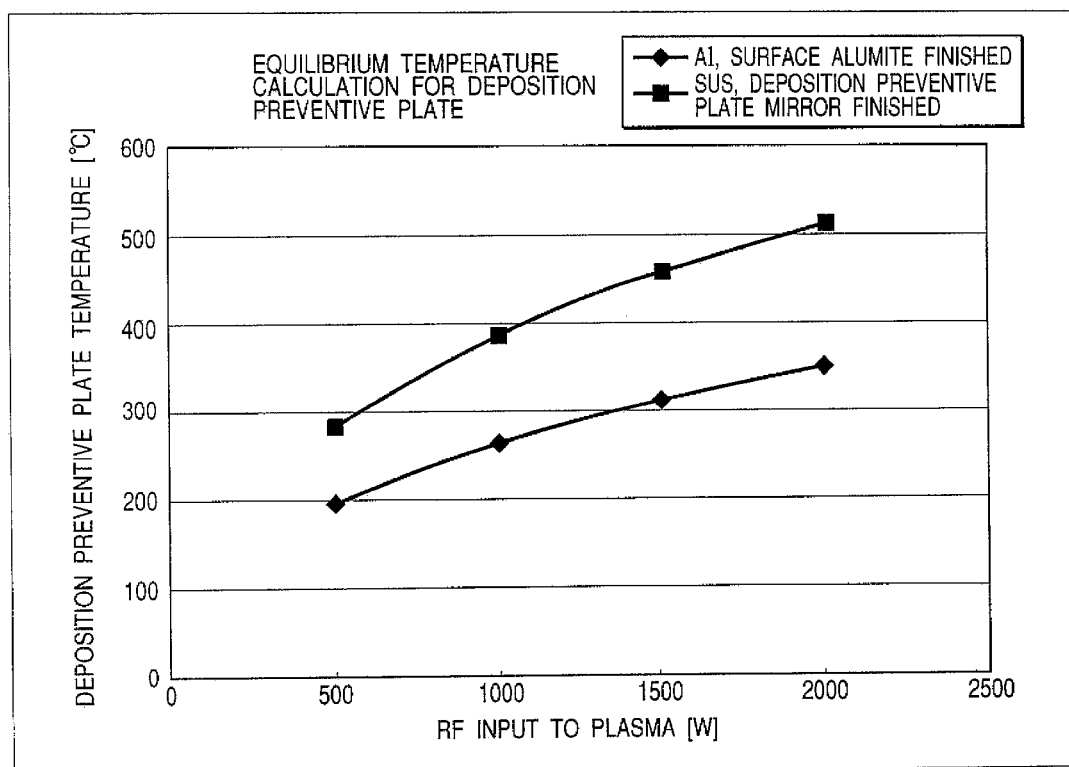
Figure 8:
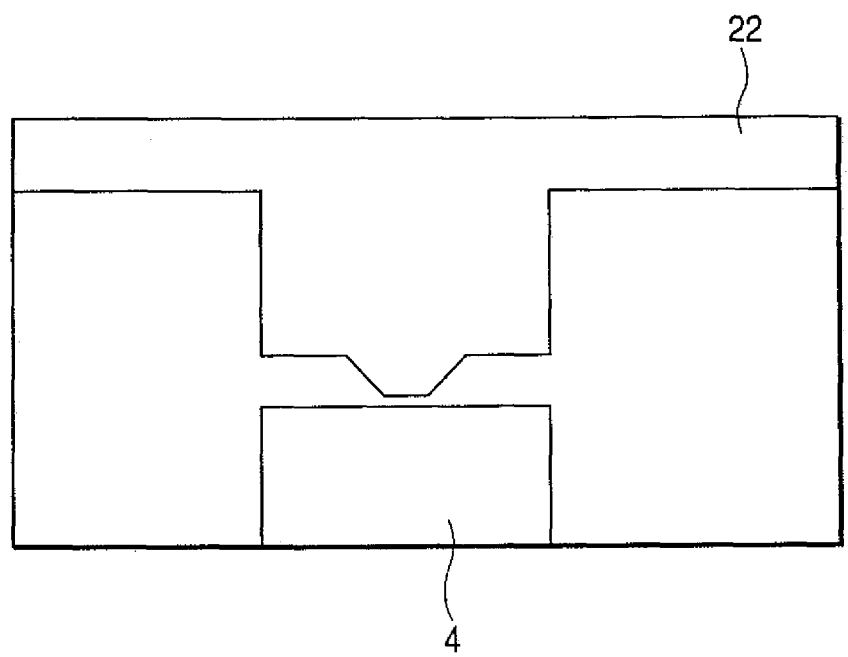
Figure 9A:
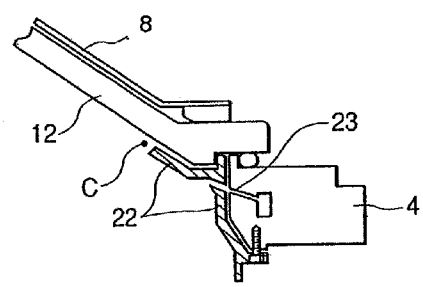
Figure 9B:
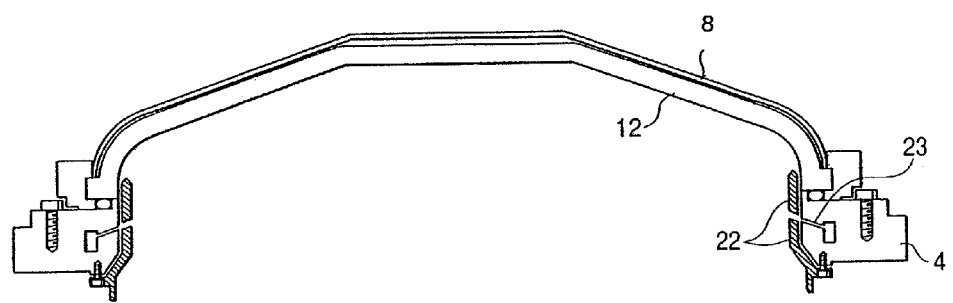
Figure 10:
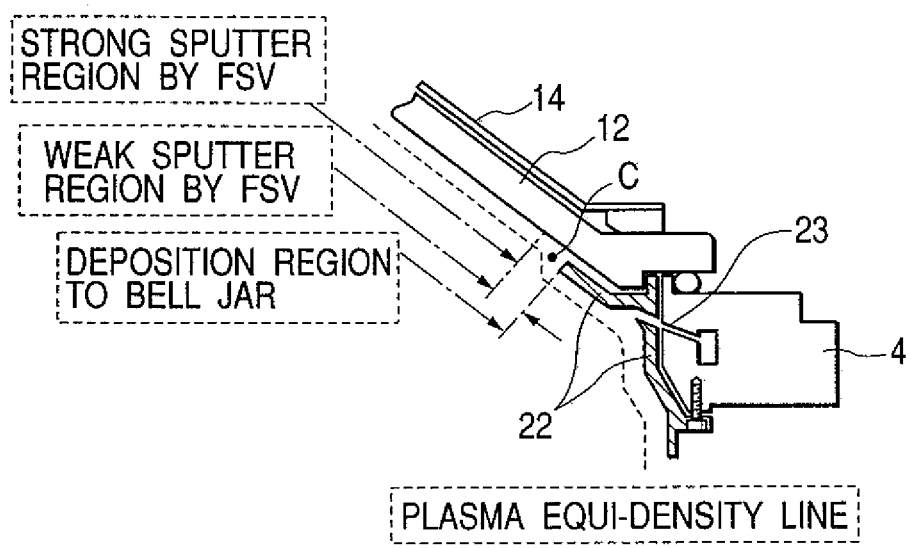
Figure 11:
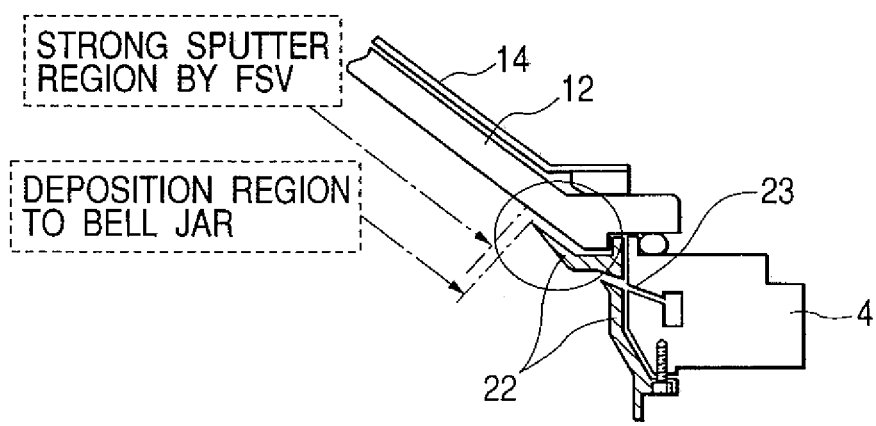
Figure 12:
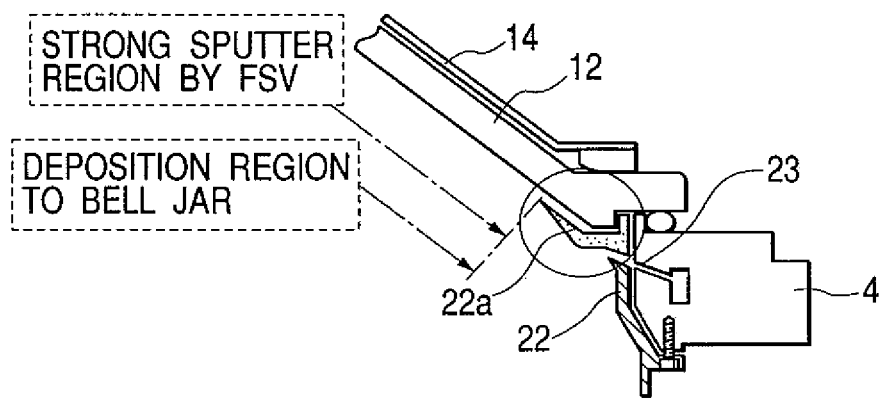
Figure 13:
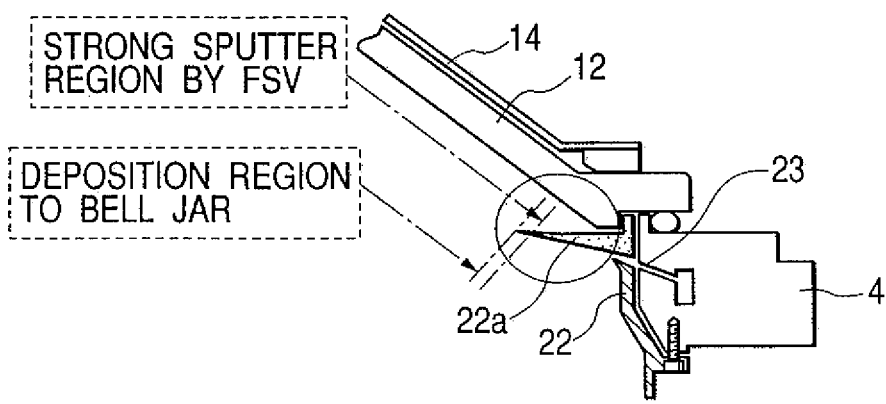
Figure 14:
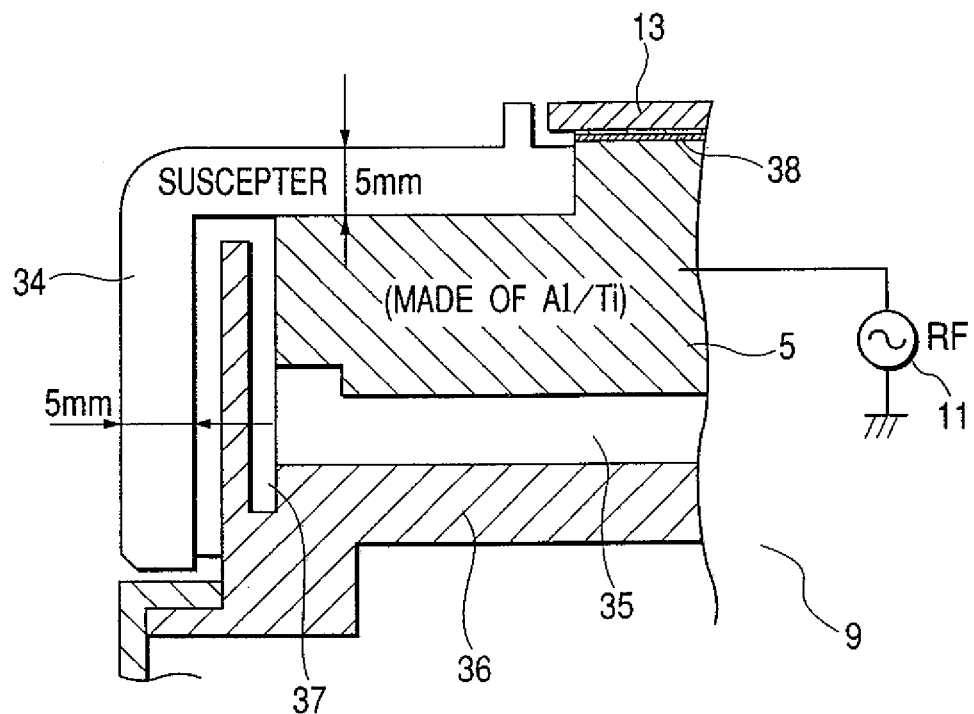
Figure 15:
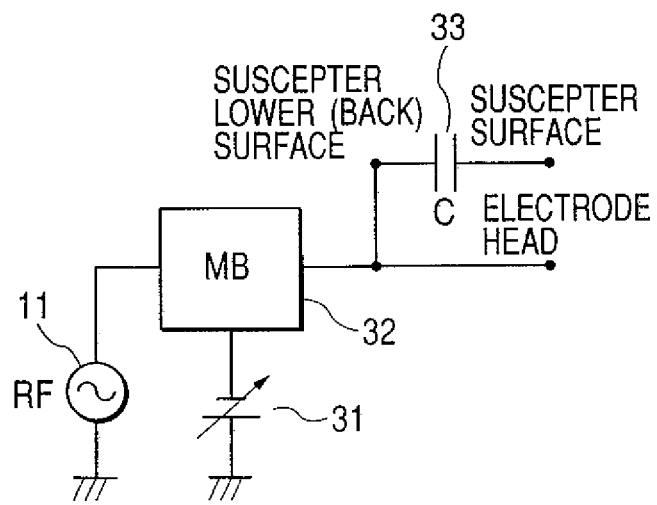
Figure 16:
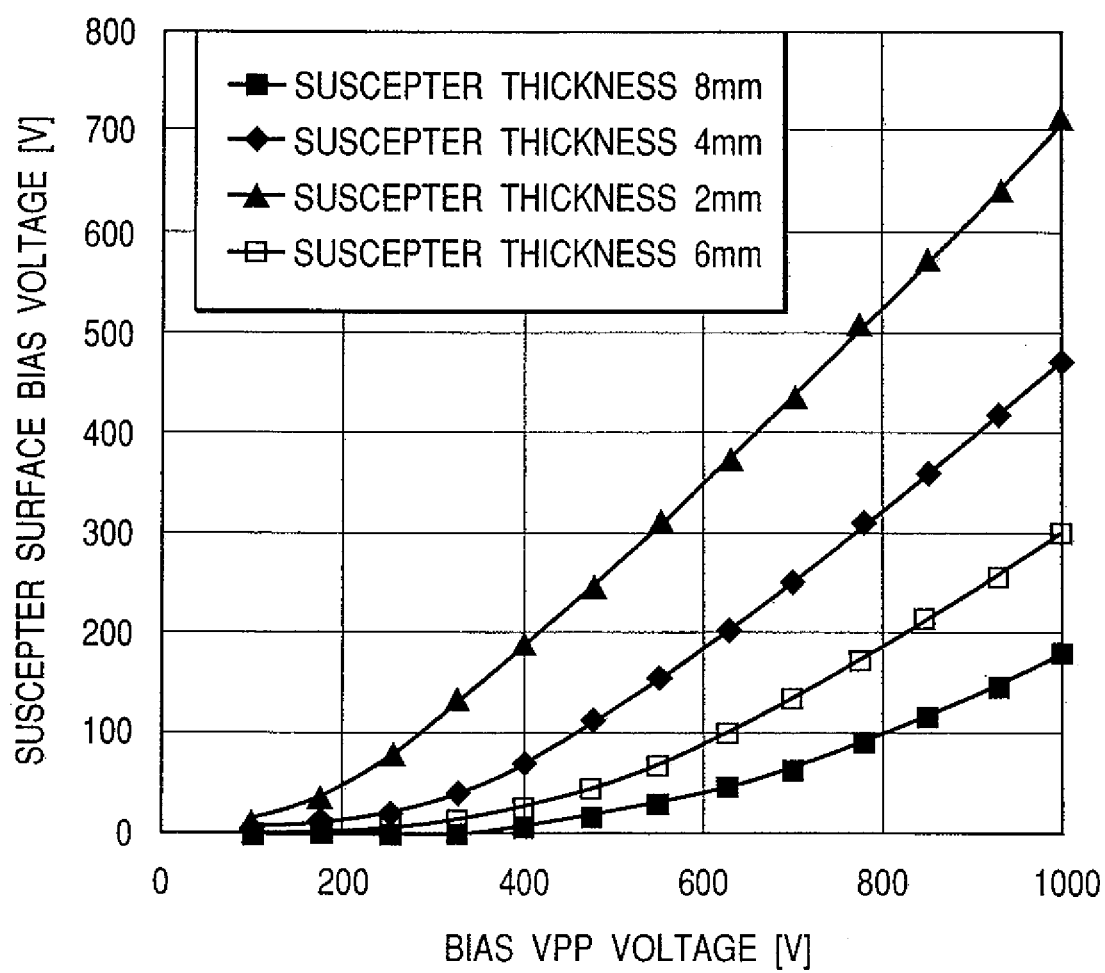
Figure 17:
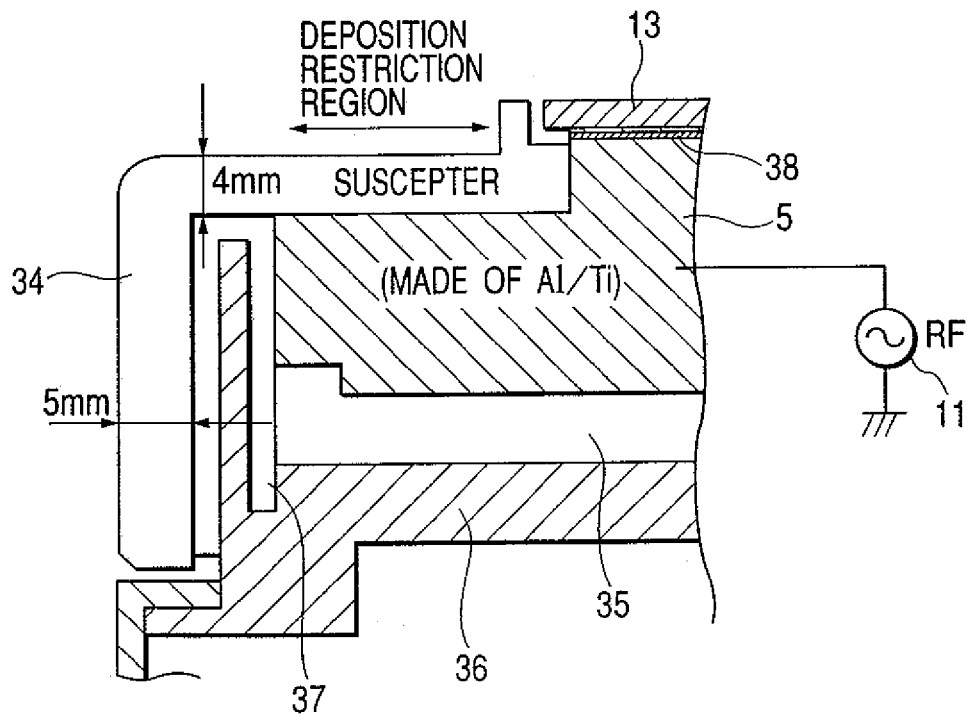
Figure 18:
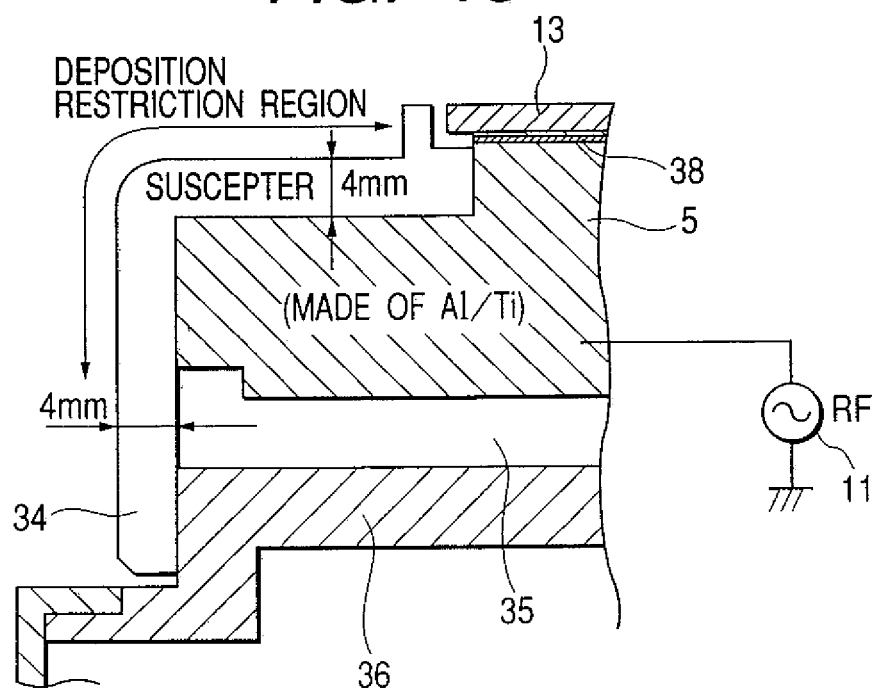
Figure 19:
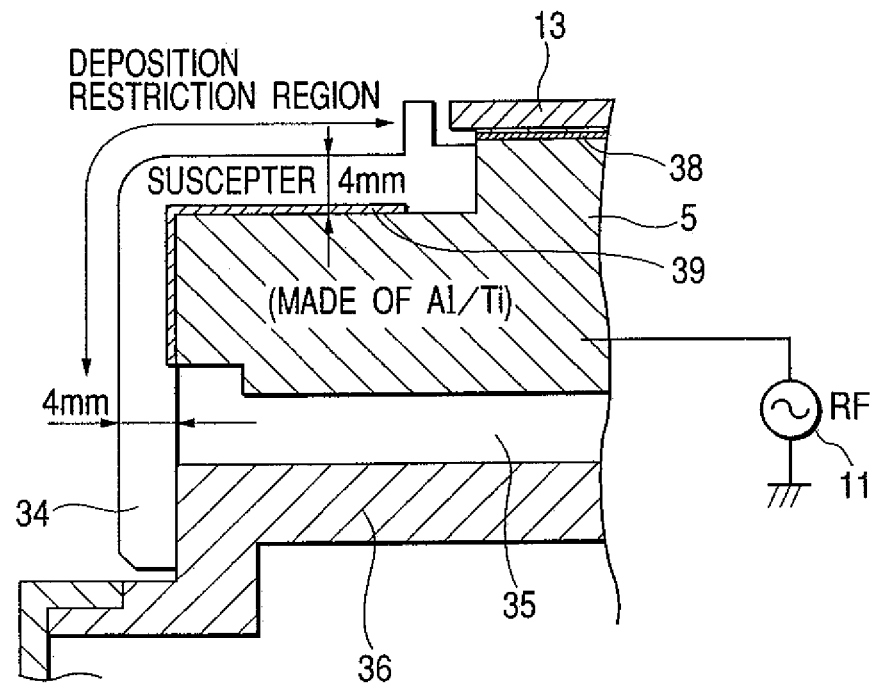
Figure 20:
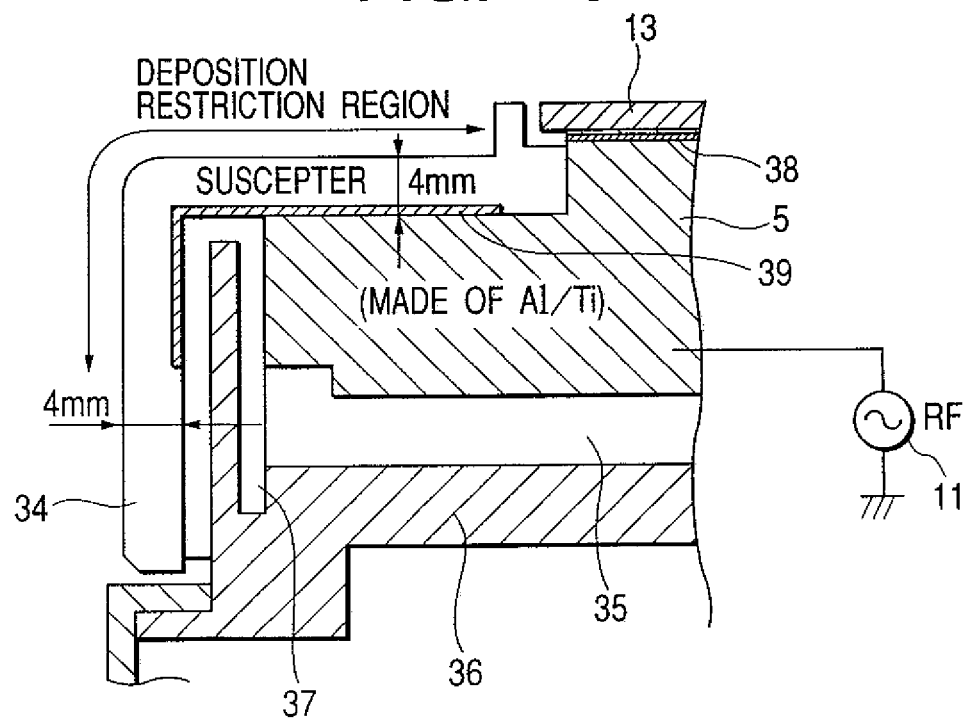
Figure 21:
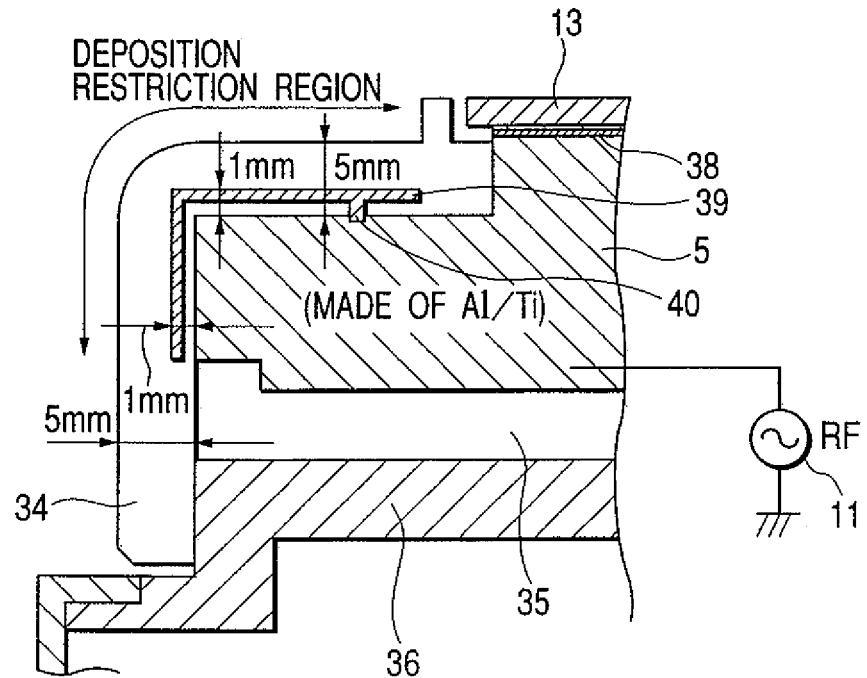
Figure 22:
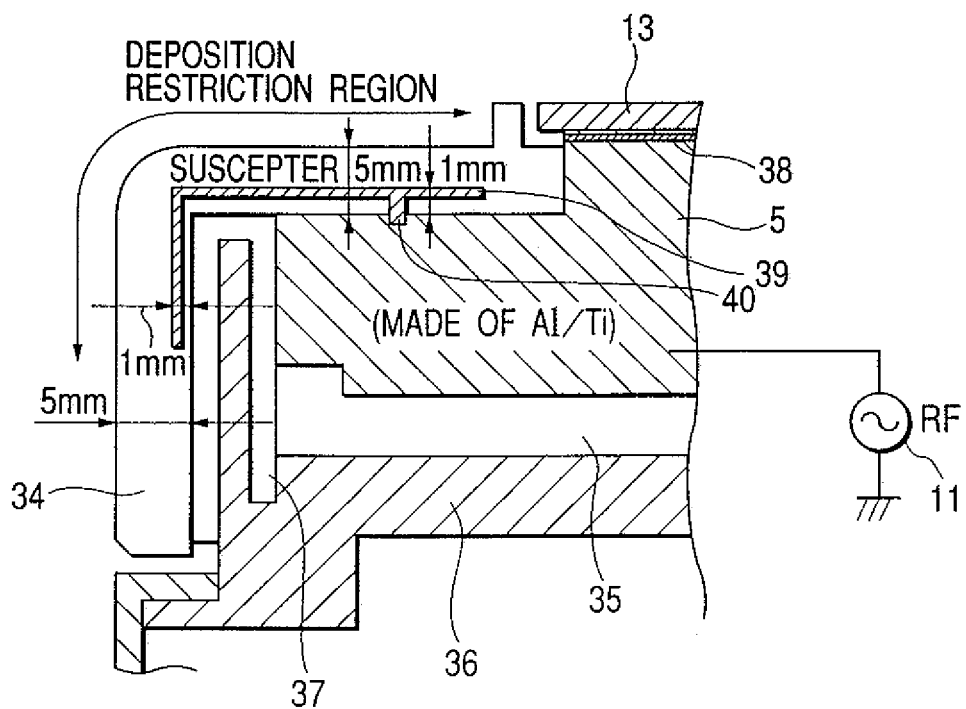
Figure 23:
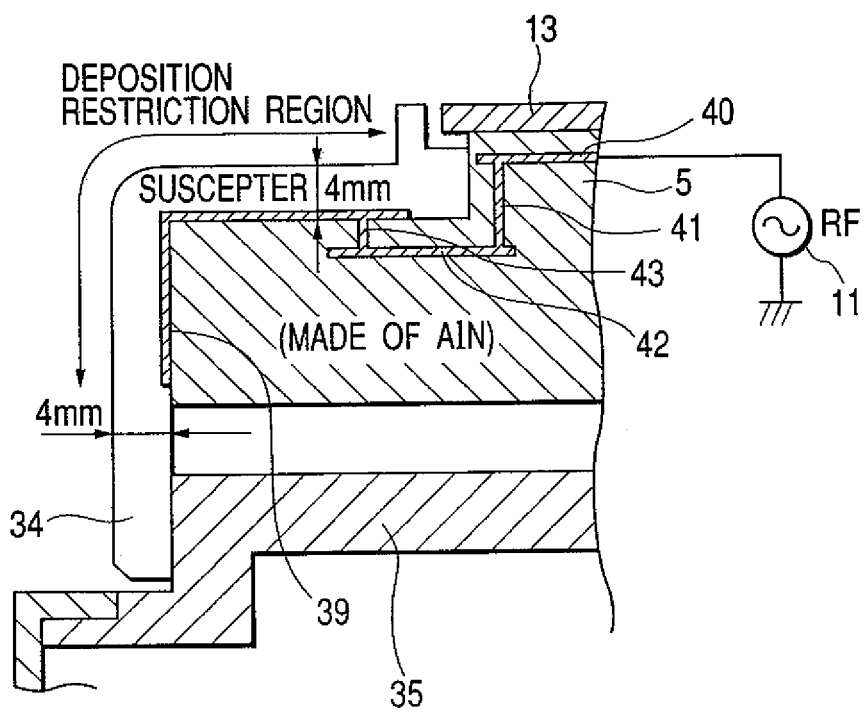
Figure 24:
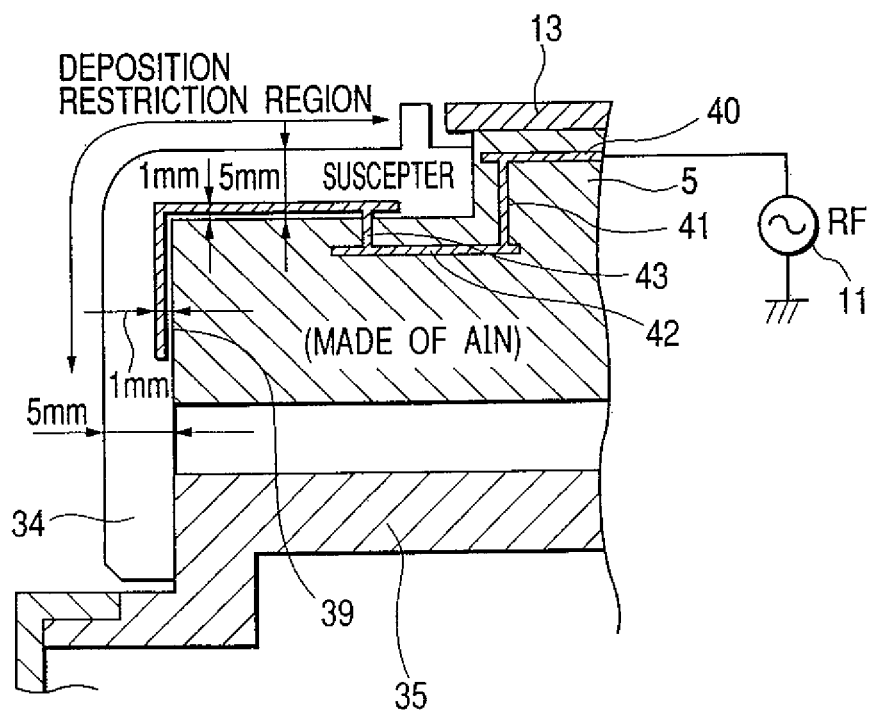
Figure 25:
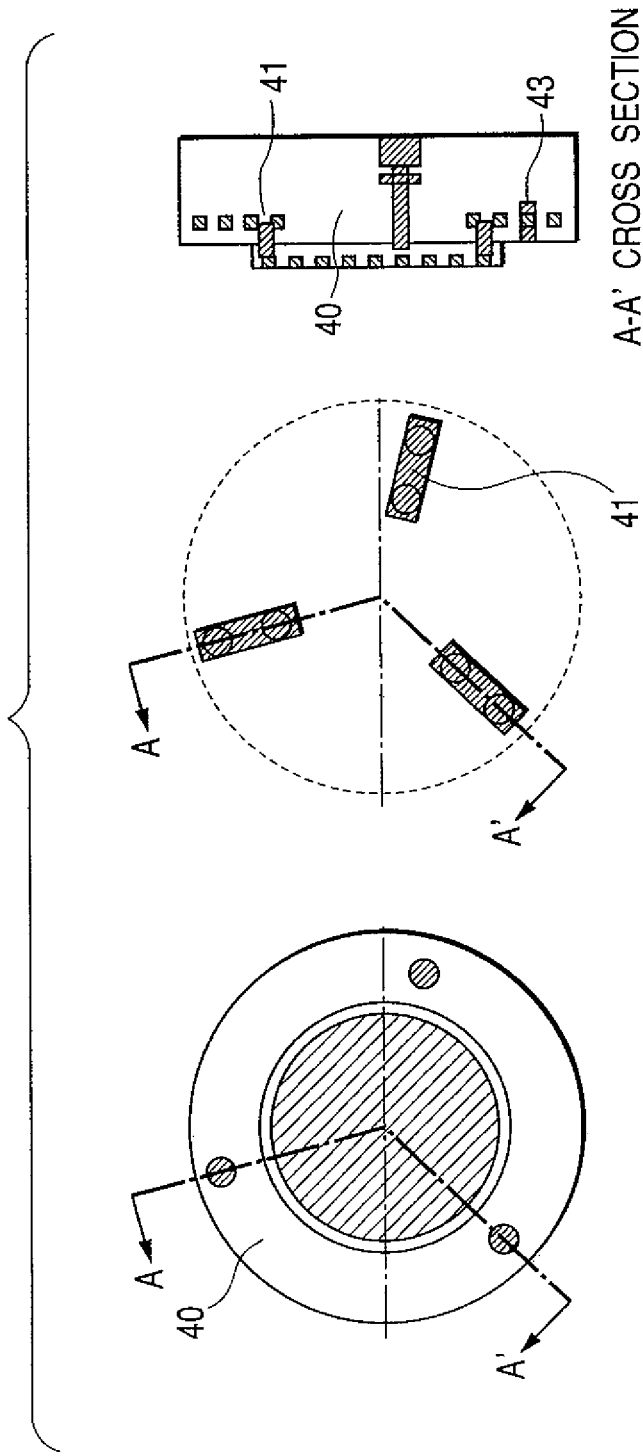
Figure 26:
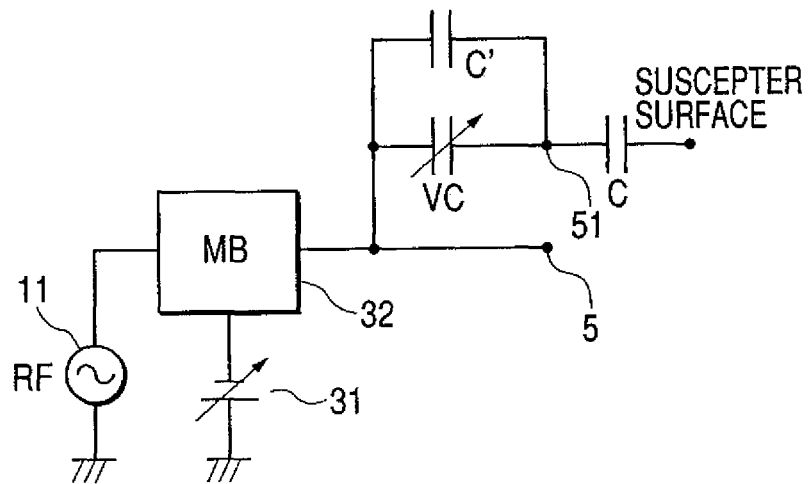
Figure 27:
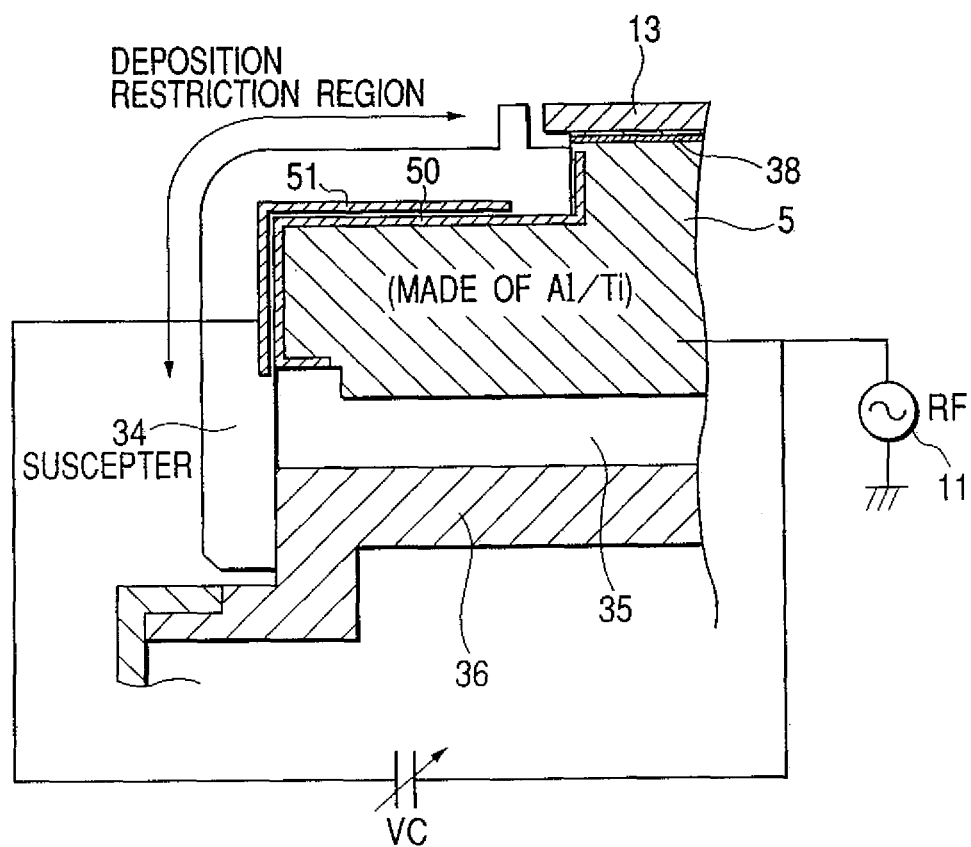
Figure 28:
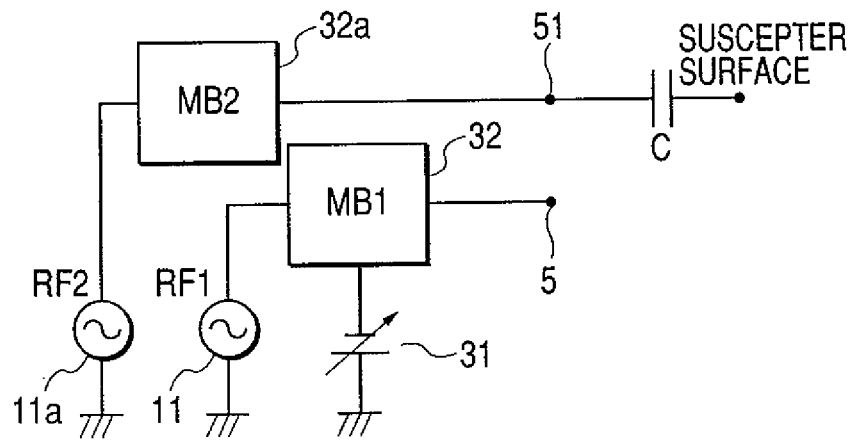
Figure 29:
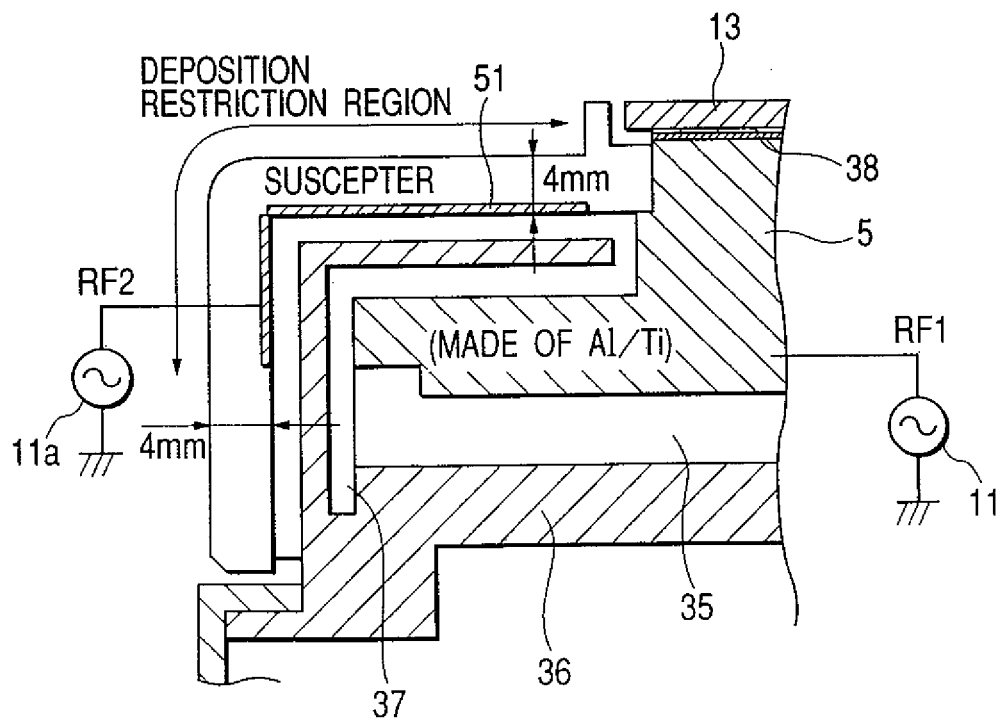
Figure 30:
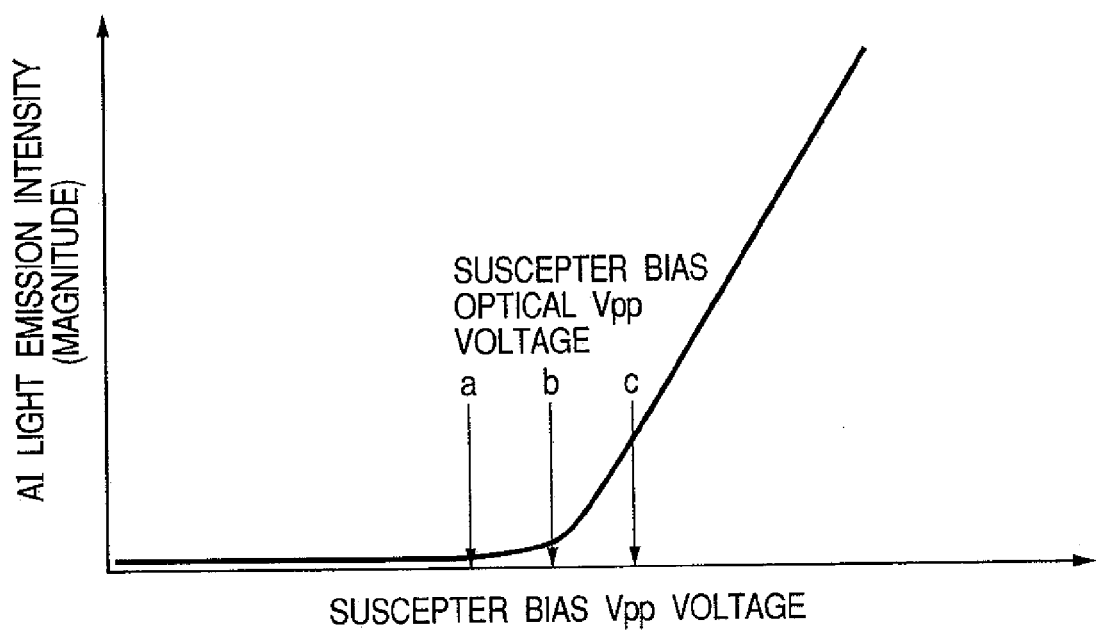
Figure 31:
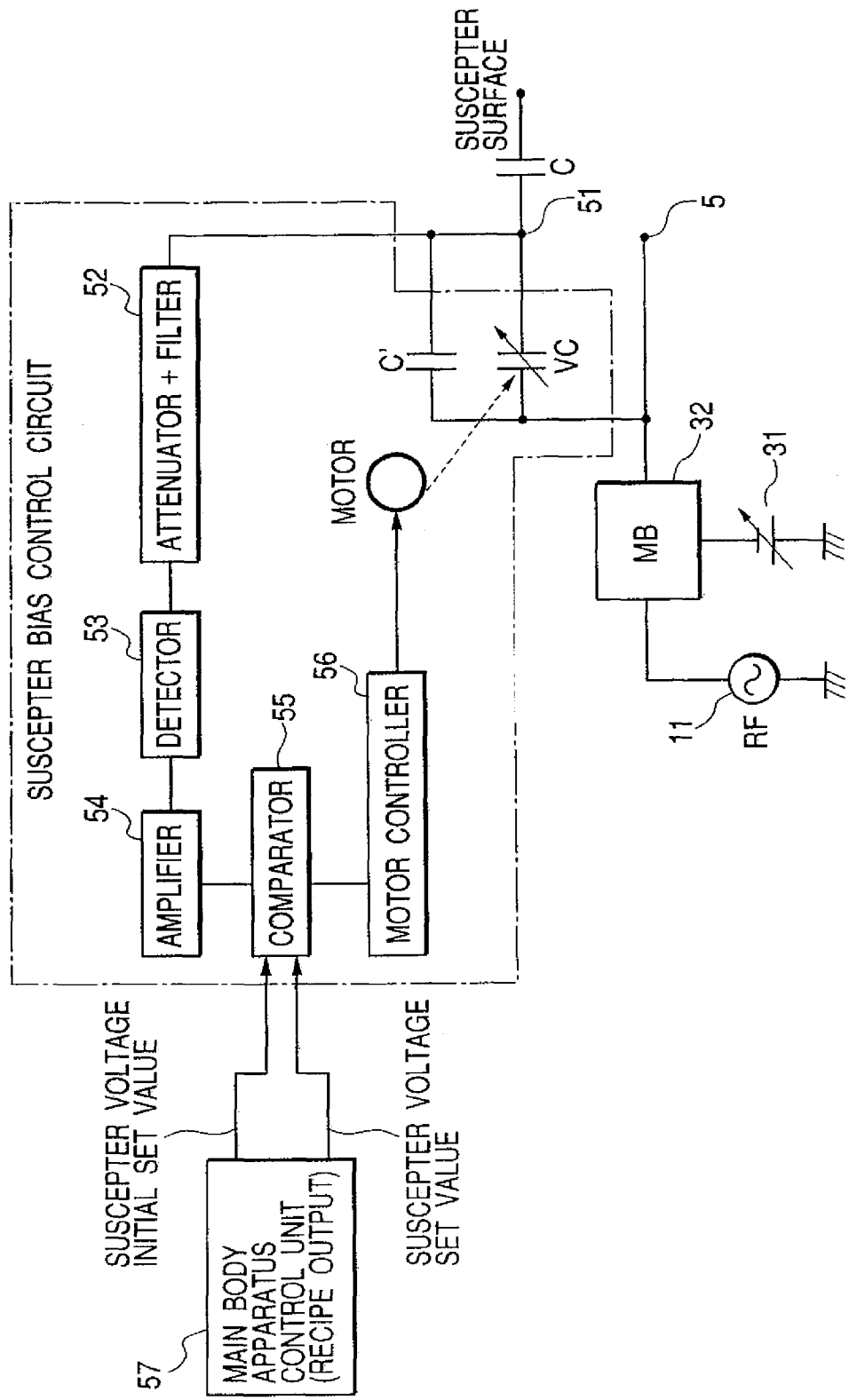
Figure 32:
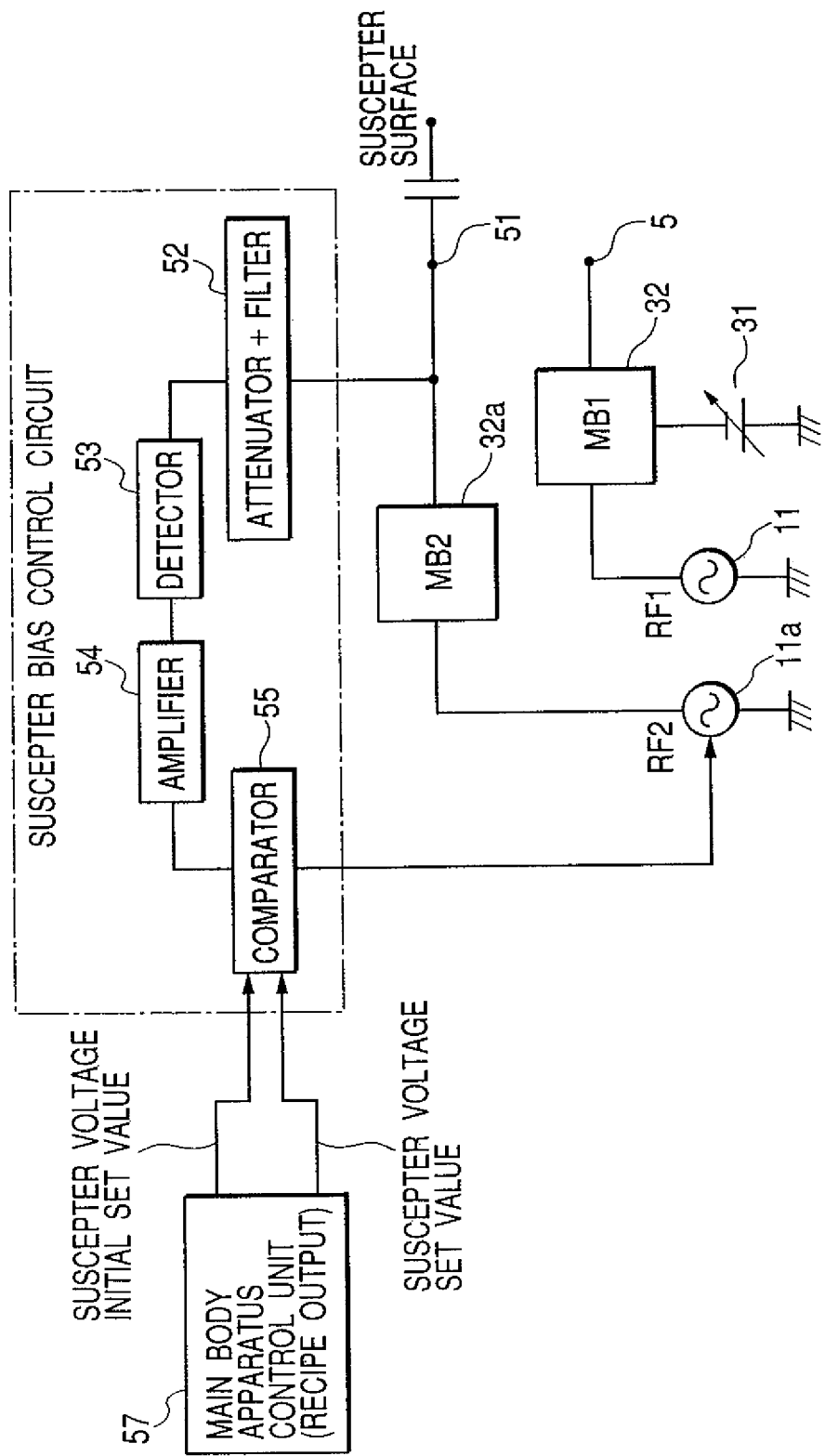
Figure 33:
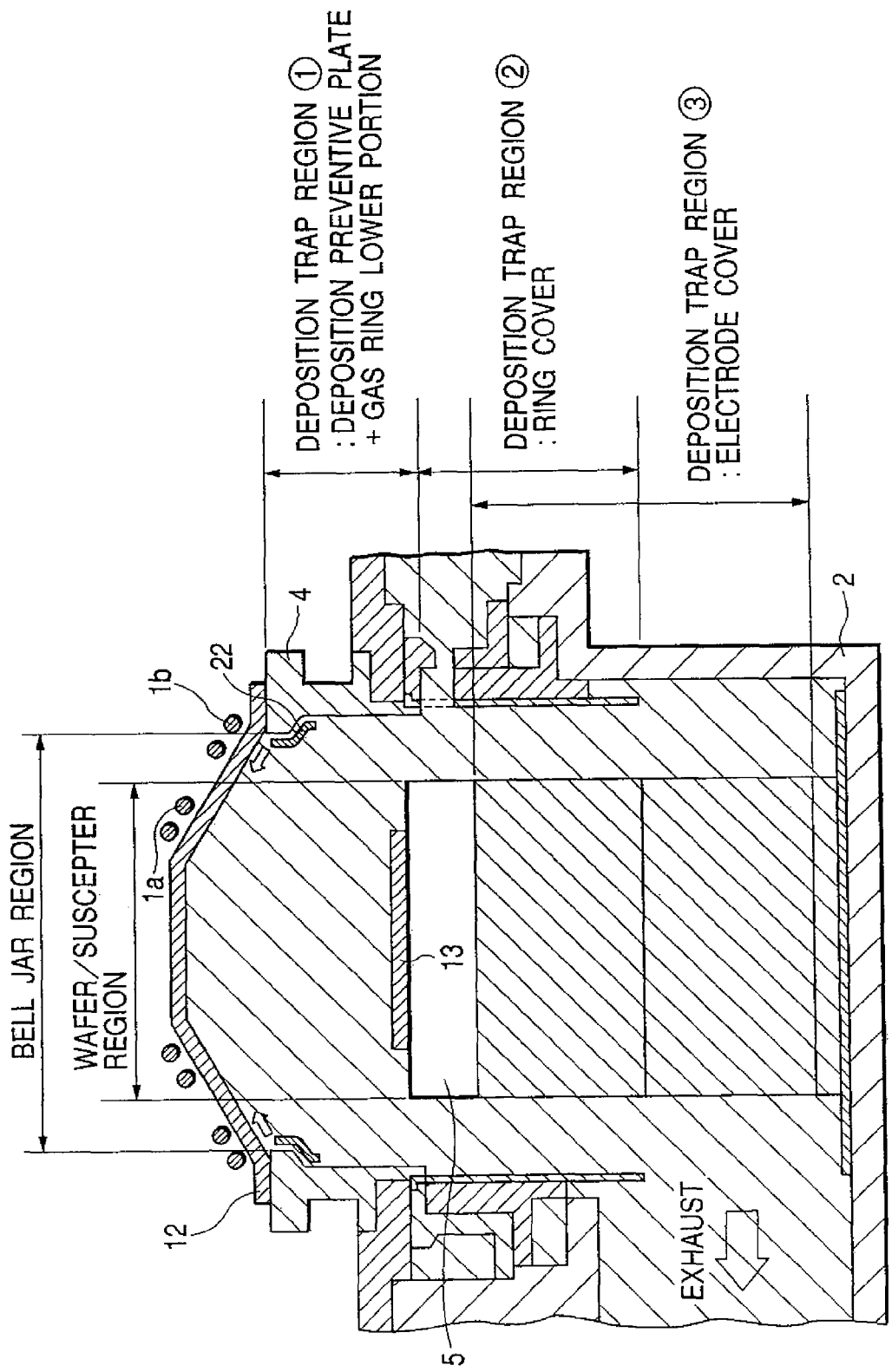

FIGS. 5(a) and 5(b) are side views showing examples of the attachment of the Faraday shield to the bell jar;

FIGS. 6(a), 6(b) and 6(c) are diagrams illustrating attaching structures and the orientation of a deposition preventive plate;

FIG. 7 is a graph showing an example of heat calculation for the deposition preventive plate;

FIG. 8 is a diagram illustrating a supporting structure for the deposition preventive plate;

FIGS. 9(a) and 9(b) are diagrams illustrating a countermeasure for preventing deposit of materials on the bell jar inner wall;

FIG. 10 is a diagram illustrating adhesion of a deposit near the deposition preventive plate;

FIG. 11 is a diagram showing an example of a structure of the deposition preventive plate;

FIG. 12 is a diagram showing another example of a structure of the deposition preventive plate;

FIG. 13 is a diagram showing a further example of a structure of the deposition preventive plate;

FIG. 14 is a sectional view showing the structure of a sample holding portion including the sample table;

FIG. 15 is a diagram of a substrate bias circuit including a susceptor surface;

FIG. 16 is a graph showing a relation between susceptor thickness and a bias voltage generated on the susceptor surface;

FIG. 17 is a sectional view illustrating the state of adhesion of a deposit on a thin-walled susceptor;

FIG. 18 is a sectional view illustrating the state of adhesion of a deposit on a thin-walled susceptor;

FIG. 19 is a sectional view showing an example of flame spraying of a metal film onto the lower surface of the susceptor;

FIG. 20 is a sectional view showing an example of flame spraying of a metal film onto the lower surface of the susceptor;

FIG. 21 is a sectional view showing an example of embedding a metal film in the susceptor;

FIG. 22 is a sectional view showing an example of embedding a metal film in the susceptor;

FIG. 23 is a sectional view showing an example of applying a susceptor having a metal film to a sample table made of ceramic dielectrics;

FIG. 24 is a sectional view showing an example of applying a susceptor having a metal film to a sample table made of ceramic dielectrics;

FIG. 25 is a sectional view showing a connection structure for a bias applying electrode;

FIG. 26 is a circuit diagram of means for controlling an RF bias voltage that is applied to a susceptor surface;

FIG. 27 is a sectional view showing a structural example of a means for controlling an RF bias voltage that is applied to a susceptor surface;

FIG. 28 is a circuit diagram showing an example of supplying an RF bias to a susceptor by using a separate power source;

FIG. 29 is a sectional view showing an example of an electrode structure in a case of supplying an RF bias to a susceptor by using a separate power source;

FIG. 30 is a graph illustrating a method of optimizing a susceptor bias voltage;

FIG. 31 is a circuit diagram of a susceptor bias application circuit having a feedback circuit;

FIG. 32 is a circuit diagram of a susceptor bias application circuit having a feedback circuit; and FIG. 33 is a sectional view showing each of the regions inside of a vacuum processing chamber.

DETAILED DESCRIPTION OF PREFERRED EMBODIMENTS

A first embodiment of the present invention will be described with reference to the drawings. In the first embodiment, a method of suppressing the deposition of reaction products, during processing, on the inner wall of a vacuum vessel will be described with reference to an example of an etching process, in a case where a sample subjected to plasma processing is made of a non-volatile material.

Figure 1:
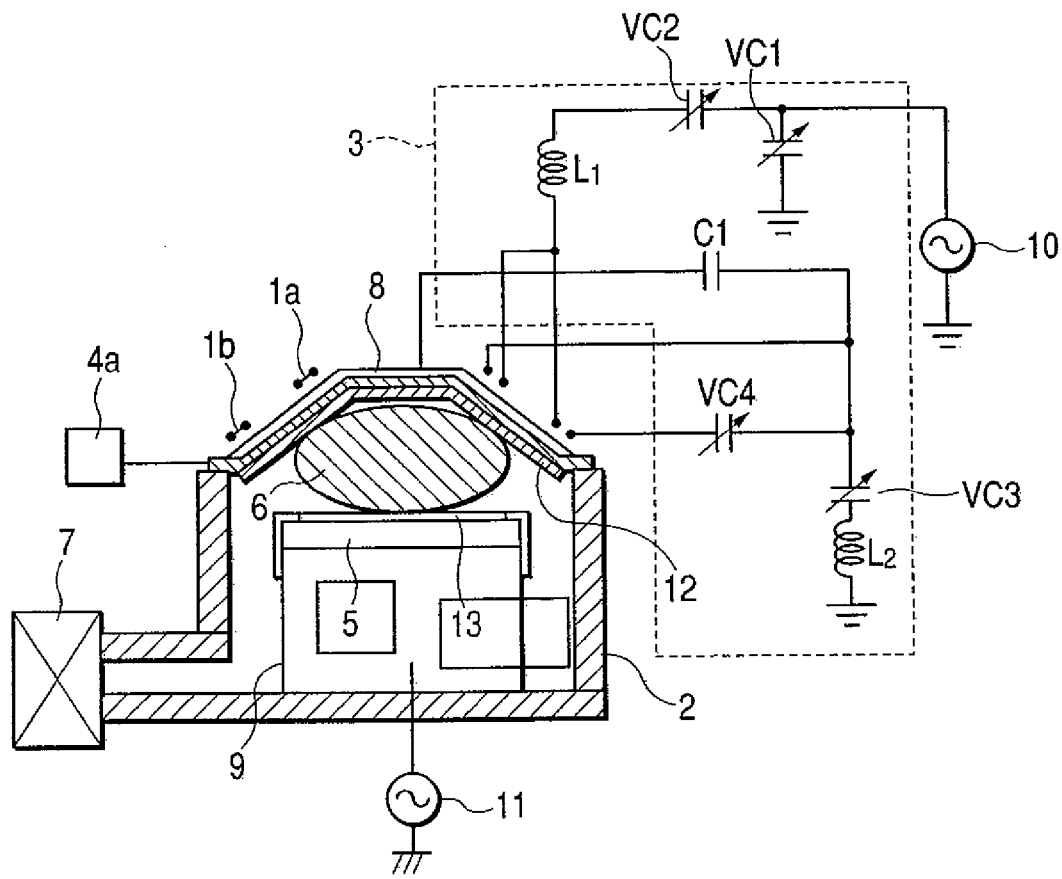
FIG. 1 is a diagram of a plasma processing apparatus according to a preferred embodiment of the present invention.

FIG. 1 is a cross sectional view of a plasma processing apparatus according to this embodiment. A vacuum vessel 2 has a bell jar 12, made of an insulative material (for example, a non-conductive material, such as quartz or a ceramic), which closes the upper portion of the vacuum vessel 2 so as to define a vacuum processing chamber. A sample table 5 for supporting a sample 13 to be processed is provided inside the vacuum vessel, and plasmas 6 are formed in the processing chamber to process the sample. Further, the sample table 5 is formed above a sample holding unit 9, including the sample table.

A coiled upper antenna 1a and lower antenna 1b are disposed on the outer circumference of the bell jar 12. A disk-like Faraday shield 8, that is placed into capacitive coupling with the plasmas 6, is disposed outside the bell jar 12. The antennas 1a and 1b and the Faraday shield 8 are connected in series, by way of a matching box 3, to an RF power source (first RF power source) 10, as will be described later. Further, a serial resonance circuit (a variable capacitor VC3 and a reactor L2), having a variable impedance, is connected in parallel between the Faraday shield 8 and the ground.

A processing gas is supplied by way of a gas supply pipe 4a to the inside of the vacuum vessel 2, and the gas in the vacuum vessel 2 is evacuated to a predetermined pressure by an exhausting device 7. The processing gas is supplied from the gas supply pipe 4a to the inside of the vacuum vessel 2. In this state, the processing gas is converted into plasmas by the effect of the electric fields generated by the antennas 1a and 1b. The sample table 5 is connected with a substrate bias power source (second RF power source) 11. This will draw ions present in the plasmas onto the sample 13.

An RF power source 10, an RF power with a HF band, such as, 13.56 MHz, 27.12 MHz or 40.68 MHz, or an RF power source of higher frequency, such as in the VHF band, is used, and plasma generating electric fields can be obtained in the vacuum vessel 2 by supplying the RF power to the induction coupled antennas 1a and 1b and the Faraday shield 8. In this case, reflection of the electric power can be suppressed by matching the impedance of the induction coupled antennas 1a and 1b with the output impedance of the RF power source 10 by use of the matching box 3. Variable capacitors VC1 and VC2, that are connected in an inverted L-shape, as shown, for example, in the figure, are used in the matching box 3.

Figure 2:
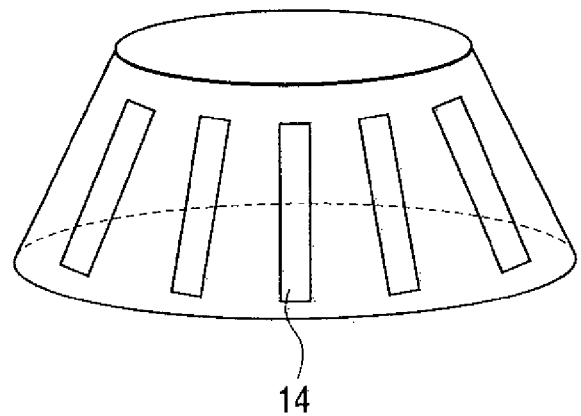
FIG. 2 is a diagrammatic perspective view of a Faraday shield.

The Faraday shield 8 is made of a conductor formed with longitudinal strip-shaped slits 14, as shown in FIG. 2, and it is disposed so as to overlap the vacuum vessel (bell jar 12), which is made of ceramics. The voltage applied to the Faraday shield 8 can be controlled by a variable capacitor (VC3 shown in FIG. 1). The voltage applied to the Faraday shield 8 (shield voltage) is preferably set to an optional value corresponding to the processing recipe or cleaning treatment recipe for every wafer.

The principle employed for the cleaning of the inner wall of the vacuum vessel by the Faraday shield is as described below. That is, a bias voltage is generated inside the vacuum vessel (inner wall of the bell jar) by an RF voltage applied to the Faraday shield, thereby drawing ions present in the plasmas toward the wall of the vacuum vessel, with the result that the vacuum vessel wall will be bombarded by the drawn ions, so as to cause physical and chemical sputtering and, thereby, prevent deposition of reaction products on the wall of the vacuum vessel.

An optimal Faraday shield voltage (FSV) exists for the cleaning of the inner wall by the Faraday shield. The optimal FSV depends on the effects of the RF power source frequency, the materials used for the vacuum vessel wall, the plasma density, the plasma composition, the constitution for the entire vacuum vessel, the materials of the sample to be processed, the processing rate and the processing area. Accordingly, the optimal FSV value has to be changed for every process.

Figure 3:
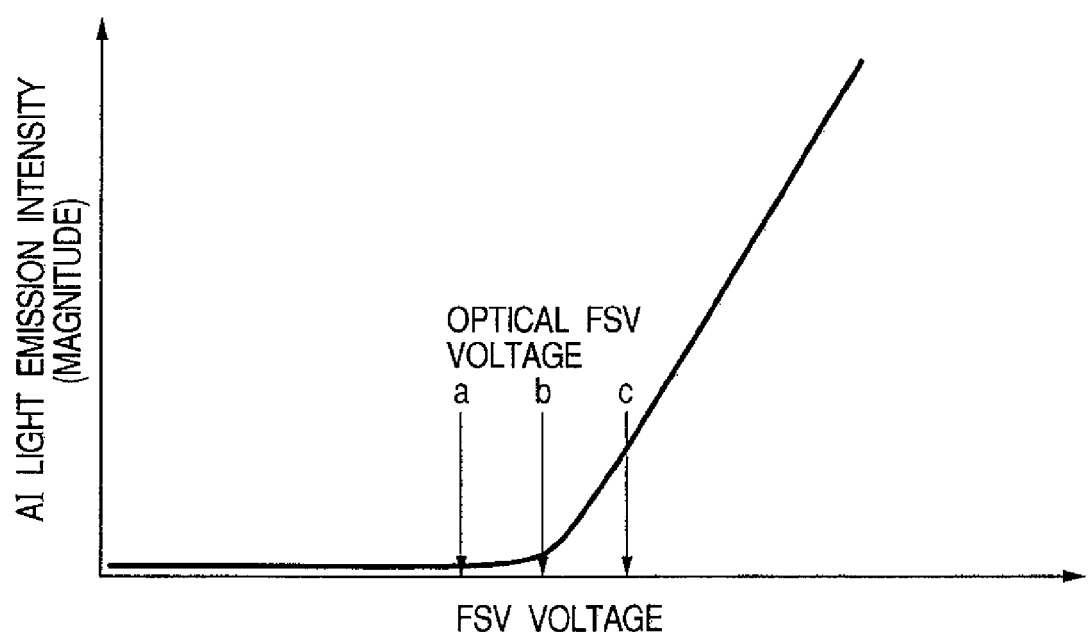
FIG. 3 is a graph illustrating a method of optimizing FSV.

FIG. 3 is a graph illustrating a method of optimizing the FSV, which graph shows a relation between the FSV and the light emission intensity (light amount) of a material used for the vacuum vessel wall (aluminum or oxygen constituting alumina in a case where the wall material is made of alumina). As shown in the graph, the light emission of the wall material increases as the FSV is increased beyond a certain FSV value (point b in FIG. 3), which serves as a boundary. This shows that, a at a value of FSV lower than the point b, not only deposits are not deposited by sputtering for the deposits, but also the wall material itself is sputtered as well at a value of FSV not lower than the point b.

While the optimal FSV value is a voltage at the point b, the point a is sometimes determined to be the optimal value depending on the process. For example, there is a case in which the processing reaction of the workpiece or the reaction in the gas phase are different from intended conditions due to the release of the wall material into the gas phase, due to the sputtering onto the material of the vacuum vessel wall, and so the desired process cannot be executed. That is, by setting the FSV to the point a, deposition of deposits is allowed, though slightly, onto the inner wall of the vacuum vessel, so that the wall material is not sputtered at all. This can prevent processing problems caused by the release of the wall material. However, for this state, it is necessary to clean the inner wall of the vacuum vessel by a process used exclusively for cleaning before substantial deposition of deposits occurs on the inner wall of the vacuum vessel (the FSV is set higher than the point b in this case).

On the contrary, point c is sometimes set as an optimal value depending on the process. For example, the desired process sometimes can not be conducted stably when reaction products are deposited even in small amounts on the inner wall of the vacuum vessel, since obstacles are generated or the RF power for generating the plasmas is absorbed by the deposits, thereby to vary the plasma characteristics. In this case, the value of the FSV is set to the point c as described above. That is, it is possible to set the condition such that the inner wall may be scraped somewhat, but the reaction products are not deposited at all. In this case, there is a drawback in that the vacuum vessel is consumed greatly, but the number of cleaning cycles for the inner wall can be decreased.

The value of the FSV is set to the point b in a case where neither the scraping of the inner wall nor the deposition of the reaction products is desirable. In this case, it is important to improve the reproducibility of the FSV setting voltage. This is because a change with the lapse of time has to be suppressed in a case of conducting the same process in a different apparatus, or conducting the same process continuously even in the same apparatus. For this purpose, feedback control for establishing the value of the FSV is important.

Figure 4:
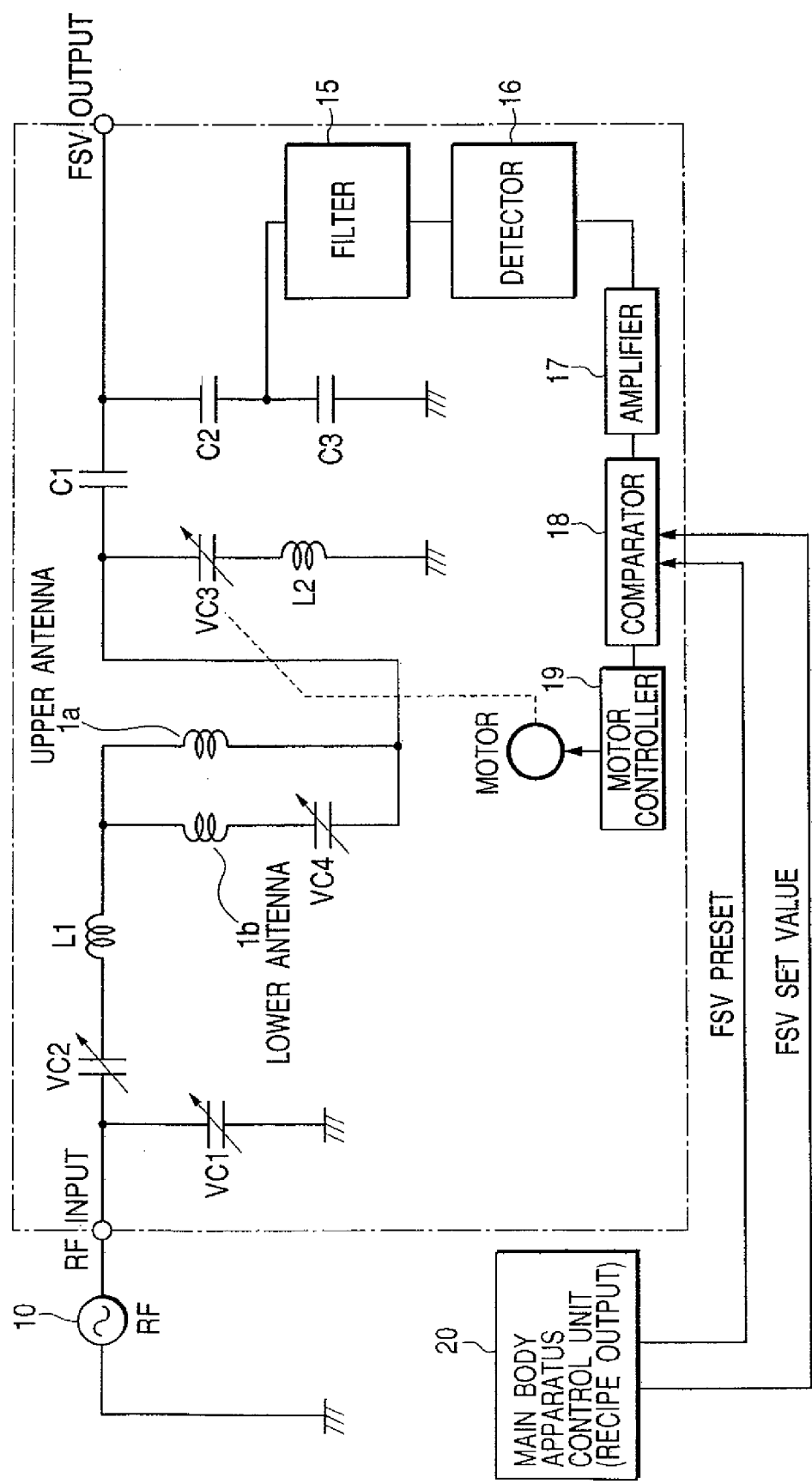
FIG. 4 is a circuit diagram illustrating FSV feedback control.

FIG. 4 is a circuit diagram illustrating how the FSV feedback control is carried out. As shown in the figure, the output of the RF power source 10 for plasma generation is applied by way of the impedance box (VC1, VC2) and antennas 1a and 1b to the Faraday shield 8. The value of the FSV is divided by the capacitors C2 and C3 into a small signal, which is passed through a filter 15 to eliminate harmonic waves or other frequency components. The signal is then detected by a detector 16, converted into a DC voltage and then amplified by an amplifier 17. Thus, a DC voltage signal in proportion to the FSV is obtained. The signal is compared by a comparator 18 with a preset value or a setting value set by the recipe output of a main body apparatus control unit 20 so as to control a motor by way of a motor controller 19, and the motor rotates a variable capacitor VC3 for determining the FSV voltage. Thus, the FSV can be controlled to a value set by the main body apparatus control section 20. For example, the FSV value can be controlled to be constant also in a case of conducting the same processing in a different apparatus or continuously in the same apparatus. Further, the difference between apparatuses or a change with the lapse of time can be suppressed.

The Faraday shield is placed in capacitive coupling with the generated plasmas through the wall (bell jar) of the dielectric vacuum vessel. As a result, the FSV is divided into a static capacitance between the Faraday shield and the plasmas and a static capacitance due to an ionic sheath formed to the wall; and, the voltage, after division, is applied to the ionic sheath. This accelerates the ions and causes ion sputtering on the inner wall of the vacuum vessel. For example, in a case where the thickness of the wall of the alumina vacuum vessel is 10 mm, the voltage applied to the ionic sheath is about 60 V for a FSV of 500 V.

An increase in the voltage applied to the ionic sheath with a low FSV is useful. This is because generation of a high FSV makes the handling difficult for the reason, for example, that this tends to cause an abnormal discharge. In order to increase the voltage applied to the ionic sheath by a low FSV, it is effective to make the static capacitance as low as possible between the Faraday shield and the plasmas, since the static capacitance of the ionic sheath is determined solely by the plasma characteristics of the process. In order to attain this, it is necessary that the dielectric constant of the material of the dielectric vacuum vessel is high and the thickness of the wall of the dielectric vacuum vessel is as thin as possible. As a material suitable for this purpose, an alumina can be adopted as a typical material having high strength and a high dielectric constant.

When a vacuum vessel of thin wall thickness is manufactured from a highly dielectric material, such as alumina, it is necessary to consider the gap between the Faraday shield and the wall (bell jar) of the vacuum vessel. Since the dielectric constant of alumina is about 8, a wall thickness of 10 mm is: 10/8=1.25 mm when converted as the thickness of atmospheric air. Assuming a case where the gap between the Faraday shield and the vacuum vessel is 0 to 1 mm, the gap between the Faraday shield and the plasma changes by nearly about one-half, for example, 1.25 to 2.25 mm, when converted as that for atmospheric air. This means that the voltage applied to the ionic sheath changes from about 33 to 60 V under the conditions described above.

When the voltage applied to the ionic sheath changes greatly, as described above, deposits adhere to some portions of the vacuum vessel, while deposits are not deposited to other portions on the inner wall of the vacuum vessel, thereby to reduce the effect of suppressing adhesion of deposits by the application of the FSV. In order to prevent this, it is necessary to make the gap between the Faraday shield and the vacuum vessel constant, or to prepare a Faraday shield with a thin film and put it into intimate contact with the vacuum vessel.

While it is easy to manufacture the Faraday shield by fabrication of a metal plate, it is not practical to manufacture it such that the gap relative to the wall (bell jar) of the vacuum vessel is 0.5 mm or less. However, the gap between the Faraday shield and the vacuum vessel can be filled by attaching a conductive elastomeric material, for example, a conductive sponge, to a portion below the Faraday shield.

FIGS. 5(*a*) and 5(*b*) are views showing examples of how to attach a Faraday shield to a bell jar. FIG. 5(*a*) shows an example where a gap is present between the Faraday shield 8 and the bell jar 12, so that deposits tend to deposit on the inner surface of the vacuum vessel at a portion where there is a gap. On the other hand, deposits are not deposited near a skirt portion where there is no gap. FIG. 5(*b*) is a view showing an example where the gap is filled with an elastomeric conductor 12*a*, for example, a conductive sponge. This can provide the Faraday shield 8 with the same effect as that provided when it is in close contact with the bell jar 12. Since the conductive sponge is highly shrinkable, it can bury gaps of different size flexibly.

FIGS. 6(*a*) and 6(*b*) are views illustrating an attaching structure of a deposition preventive plate. FIG. 6(*a*) shows a gas blowing port 23 formed in the vicinity of a skirt portion of the bell jar 12, in a gas ring 4 positioned thereblow. In the illustrated arrangement, when plasma processing is continued, deposits are deposited at in the areas indicated by A and B of the figure. The deposits can be prevented from forming on the inside of the bell jar above the area B in the figure by the ion sputtering effect of the FSV. However, some consideration has to be given to the areas A and B. The area A is in the periphery of the gas blowing port 23; and, when deposits adhere there, the deposits are liable to peel off due to the effect of the gas stream and deposit as obstacles on the wafer serving as the workpiece, thereby to hinder the process. Further, while the area B is at the inner wall of the bell jar 12, the Faraday shield 8 is spaced at this point far from the inner wall of the bell jar. Accordingly, the ionic sheath voltage due to the FSV is lowered in this area, and so the effect of suppressing the adhesion of the deposits by ion sputtering is not so effective for the area B.

FIG. 6(*b*) is a view showing a structure for covering the gas blowing port 23 with a deposition preventive plate 22 which is ring shaped. The area A is at the periphery of the gas blowing port, and the adhesion of the deposits to this portion has to be decreased as much as possible. In order to decrease the adhesion of deposits to the gas blowing port 23, it is necessary to decrease the region of the plasmas 6 which can be seen from the gas blowing port 23 through the hole of the deposition preventive plate 22, that is, to decrease the view angle relative to the plasmas; and, it is also necessary that the gas blowing port 23 does not extend directly to the wafer, that is, the central axis of the gas blowing port 23 is set in the direction of the plasma forming space above the sample, such that the sample is contained in a region out of the view angle.

FIG. 6(*c*) is a view showing a detailed example of the relation between the deposition preventive plate and the gas blowing port. In this example, the view angle is decreased to about 30°, so that the wafer cannot be viewed directly through the gas blowing port.

It is effective to provide a gap between the deposition preventive plate 22 and the gas jetting port 23. The size of the gap is preferably 0.5 mm or more. The gap provides several advantages. First, even with a hole of the same size being formed in the deposition preventive plate for passing the gas, the view angle to the plasmas can be made smaller by providing the gap, and the amount of deposits that adhere to the gas blowing port 23 can be decreased. Further, when a gas is blown from the gas jetting port 23 into the vacuum vessel, a large lowering of pressure occurs, and the gas is formed from a viscous flow into an intermediate flow, and, finally, it is formed into a molecular stream. In this case, at the periphery of the gas blowing port 23, the pressure of the gas is still relatively high, and the gas is in a state of intermediate flow, so that the deposits that adhere at the periphery of the port are affected by the gas stream and tend to be peeled. By the provision of the gap, the gas flow near the deposition preventive plate 22 is formed into a molecular stream, and the gas stream has less effect of peeling the deposits that have adhered on the deposition preventive plate, thereby to decrease the peeling of the deposits. Further, as will be described later, the temperature of the deposition preventive plate 22 can be elevated efficiently to decrease the amount of deposits that adhere to the deposition preventive plate 22.

FIG. 7 is a graph showing an example of the results of a heat calculation for the deposition preventive plate. The result of processing has provided a finding that a material, such as Fe or Pt, is less likely to adhere to a member at a temperature of 250° C. or higher. Thus, the deposition preventive plate was designed such that the temperature of the deposition preventive plate is maintained at 250° C. or higher. In the heat design, the heat balance was calculated for the input heat from the plasmas, the heat dissipation from the supporting portion or the deposition preventive plate and the dissipation of radiation heat from the entire deposition preventive plates. FIG. 7 shows the result of the heat calculation.

In the case of a deposition preventing plate made of SUS (stainless steel), it can be seen that the equilibrium temperature exceeds 250° C. at an RF input to the plasmas of about 500 W. In the case of a deposition preventive plate made of Al (alumite finished surface), the equilibrium temperature of the deposition preventive plate is 250° C. or higher at an RF input of 1000 W. The structural features for each of the portions will be described on the basis of the calculation.

Since plasma input heat is diffused isometrically in a reactor, it is calculated as RF input plasma×the area of the deposition preventive plate/entire plasma contact area. In the deposition preventive plate designed now, the input heat to the deposition preventive plate is 260 W at a RF input to the plasmas of 1200 W.

The dissipation of heat irradiation from the deposition preventive plate can be suppressed to a low value, since the surface radiation rate can be decreased to about 0.2 by applying mirror finishing to the surface. In the case of using Al (alumite finished surface) for the deposition preventive plate, the diffusion of heat radiation is somewhat increased, since the radiation ratio of the alumite surface is about 0.6.

FIG. 8 is a diagram showing a supporting structure for the deposition preventive plate. The heat conduction surface is decreased by supporting the deposition preventive plate for the entire circumference at three points, so as to decrease the heat transfer from the supporting portion and bring the area of contact with the gas ring main body into a substantially point-to-point contact. As a specific example, the radial length of the portion of contact is defined as 3 mm and the circumferential length of the portion of contact is defined as 1 mm. Even when the contact heat resistance is assumed to an excessive value of about 3000 [W/(m$^2$·K)], the heat transfer from the supporting portion of the deposition preventive plate, calculated according to: area of contact×contact heat transmission ratio×(temperature at the inner surface of deposition preventive plate-temperature of gas ring), is only about 10 W.

A deposition preventive plate was manufactured as a trial to measure the actual surface temperature. The material of the deposition preventive plate was Al (alumite finished surface). At an RF input of 1200 W, it was confirmed that the surface temperature was about 250° C., which was substantially the design value.

As described above, adhesion of the deposits can not be eliminated completely even when the deposition preventive plate is kept at a high temperature. Therefore, it is important to ensure that the deposits stably adhere to the deposition preventive plate. For this purpose, it is desirable that the surface of the deposition preventive plate have an unevenness to some extent, in order to mechanically improve the adhesion of the deposits. According to an experiment performed by the inventors, it has been found that the surface roughness should preferably be 10 μm or more.

However, when adhesion of the deposits is started, the thickness of the adhered deposits is gradually increased from the thin film state. For example, an unevenness of 10 μm formed in the deposition preventive plate has an anchoring effect on deposits with a film thickness of about 10 μm. However, as the thickness of the adhered deposits increases, the anchoring effect is reduced. Accordingly, in order to effectively provide a sufficient anchoring effect, from the initial state where the adhesion amount of the deposits is small to a state where the amount of the deposits increases to some extent, it is preferred that two types of unevenness, for example, a 10 μm unevenness and a 100 μm unevenness, are formed simultaneously on the surface. Suitable method for forming such an unevenness include knurling for the formation of the 100 μm unevenness and blasting fabrication for formation of the 10 μm unevenness.

As has been described above, in order to elevate the temperature of the deposition preventive plate, it is preferred to apply mirror finishing to the surface of the deposition preventive plate and apply unevenness formation to the surface for causing the deposits to stably adhere. Accordingly, in practice, unevenness can be formed in the deposition preventive plate on the surface where the deposits adhere (plasma facing surface), and mirror finishing can be applied to the surface where no deposits adhere (for example, the surface facing the gap between the deposition preventive plate and the gas blowing port). Further, to reflect heat irradiated from the deposition preventive plate, mirror finishing is preferably applied to the surface of the gas blowing port, where deposits do not adhere.

The size of the deposition preventive plate is preferably a minimum size necessary for covering the gas blowing port. This is because deposition of the deposits, to some extent, on the deposition preventive plates is inevitable, and thermal hysteresis is caused in the deposition preventive plate due to the elevating of the temperature to decrease the adhesion of the deposits. Such deposits are liable to peel off due to the difference between the thermal expansion and shrinking amounts of the deposits and the deposition preventive plate material.

Further, the deposition preventive plate is preferably manufactured with an electroconductive material, and it is preferably electrically grounded to the earth. This is because the electric discharge is stabilized as the grounding area relative to the radio frequency waves for the generation of plasmas is increased. Further, since the deposits are liable to peel off due to the repulsion between the deposits, by the coulomb effect, when the deposits are electrostatically charged, grounding is provided for the purpose of preventing electrostatic charging on the deposits as much as possible.

The structural design and the heat design described above were carried out, a deposition preventive plate with the surface roughness of 10 μm and 100 μm was manufactured, and platinum Pt was continuously etched for 500 sheets to examine the performance. As a result, adhesion of the deposits to the gas blowing port was scarcely observed. Further, deposits that adhered to the deposition preventive plate were stable and peeling of the deposits did not occur.

FIGS. 9(*a*) and 9(*b*) are views showing a countermeasure for the deposits that have adhered to the surfaces in the area B in FIG. 6(*a*) (the portion on the inner wall of the bell jar 12 where the Faraday shield is spaced far from the inner wall of the bell jar, and, accordingly, a portion where the ionic sheath voltage by FSV is lowered and the effect of suppressing the adherance of deposits by ion sputtering is not effective).

The portion B in FIG. 6(*a*) is a region where the ion sputtering due to the FSV is less effective, since the distance between the inner wall of the bell jar 12 and the Faraday shield 8 is large in this area. Thus, as shown in FIG. 9(*a*), when the deposition preventive plate 22 is configured to have a part which is extended to cover an area of the portion B of the skirt portion of the bell jar as illustrated in FIG. 6(a), the adhesion amount of the deposits can be decreased and the deposits can be stabilized. FIG. 9(a) shows a structure to accomplish this purpose. When a test was conducted on the adhesion of deposits by using the structure of FIG. 9(a), it was found that deposits adhered to a region of about 15 mm in width of the bell jar on the inner wall, around point c in FIG. 9(a) as a center.

FIG. 9(b) shows a modified example of the structure of FIG. 9(a). As shown in the figure, the bell jar 12 is formed such that the inner surface thereof is substantially contiguous with the inner surface of the gas ring 4, and the bell jar 12 is disposed on the gas ring 4 to form the vacuum processing chamber. With this constitution, the deposition preventive plates can be formed continuously with the inner surface of the bell jar and the inner surface of the gas ring. Thus, the region where the ion sputtering due to the FSV is less effective can be protected effectively by the deposition preventive plate.

FIG. 10 is a view showing adhesion of deposits near the deposition preventive plate. The dotted line in the figure is an equi-density line of the plasmas. The point c corresponds to a corner formed by the deposition preventive plate and the bell jar, and the density of plasmas is slightly lower at this portion compared with that for the periphery. This is because plasmas are less likely to turn behind the point c due to the thickness of the deposition preventive plate. Accordingly, it is probable that the deposits at this location are less detached, since the amount of ion sputtering per unit area on the inner wall of the bell jar is smaller at the point c. There may be another reason. That is, because the deposition preventive plate is electroconductive and the FSV is not effective with respect to the ionic sheath formed in the area of the deposition preventive plate, and a DC voltage of about 15 to 20 V, determined by plasma characteristics, is applied to the ionic sheath. On the contrary, in a region where the FSV is effective, an RF voltage, for example, of about 60 V, is further applied, in addition to the DC voltage determined by the plasma characteristics, onto the ionic sheath formed on an inner wall of the bell jar, which effectively accelerates ions to sputter the inner wall of the bell jar. That is, the periphery of the point c corresponds to a transition region from the ionic sheath at a low voltage formed in the deposition preventive plate to the ionic sheath at high voltage formed in the inner wall of the bell jar, and the periphery for the point c is a region where the ionic sheath voltage is increased and the ion sputtering becomes more effective gradually as it proceeds from the vicinity of the deposition preventive plate.

It is probable that a weak sputter region due to the FSV is formed near the point c, as shown in FIG. 10, for the two reasons described above. It is also probable that deposits adhere in the region, since adhesion of the deposits is predominant over the sputtering produced by the FSV.

FIGS. 11, 12 and 13 are views respectively showing structural examples of the deposition preventive plates.

As shown in FIG. 11, a knife edge-shaped deposition preventive plate was manufactured in order to remove the cause for the lowering of the plasma density, which is one of the reasons why a weak sputter region is formed, and a test was conducted. As a result, as shown in FIG. 11, it was confirmed that the weak sputter region is contracted, and the deposit adhesion region is contracted.

Then, to remove another cause, when an upper portion 22a of the deposition preventive plate is changed to an insulator (alumina in this case), the strong sputter region and the deposition region can be allowed to coincide with each other with scarcely any adhesion of the deposits, as shown in FIG. 12. Since knurling is impossible for the surface of alumina, unevenness was fabricated on the surface by a blast treatment. Further, as the material of the insulator, quartz or aluminum nitride can also be used.

To further prevent adhesion of deposits more thoroughly, it may suffice to cause the strong sputter region wider, even if only slightly, than the deposit adhesion region, as shown in FIG. 13. Thus, a gap was provided between a part 22a of the deposition preventive plate 22 and the skirt portion of the bell jar 12 such that plasmas could intrude between the deposition preventive plate and the bell jar. To allow the entrance of plasmas, it is necessary that the size of the gap be substantially larger than the ionic sheath and be 5 mm or more. On the contrary, if it is excessively large, since the deposits are turned behind by diffusion, the effect is reduced. Since the maximum value for the gap needed to inhibit the deposits from being turned behind by diffusion is determined on the basis of the material of the deposits, as well as the species and the pressure of the gas, it is set to about 15 mm as a result of a test, while it is different depending on the processing process. As a result of manufacturing a deposition preventive plate having the structure shown in FIG. 13 and conducting a test, it was found that adhesion of deposits to the bell jar could be completely suppressed. In this structure, it is not necessary for the upper portion of the deposition preventive plate to be made of an insulative material, but the same performance can be obtained even when it is made of an electroconductive material.

An upper portion of the susceptor, serving as a cover for the sample table 5, also causes obstacles formed on the wafer when the deposits adhere thereto. Thus, an RF bias is applied also to the susceptor to cause physical and chemical ion sputtering, so that deposits will not adhere.

FIG. 14 is a view showing the structure of a sample holding portion 9, including a sample table. As shown in the drawing, the sample table 5, that is connected to receive a substrate bias voltage 11, is mounted on a ground base 36 and an insulation base 35. As the material for the sample table, aluminum or titanium alloy is used generally. A dielectric film is formed in an upper portion of the sample table, but at a portion for mounting a workpiece (sample 13), such that the workpiece can be electrostatically attracted. While the dielectric film is made of a flame sprayed film in the embodiment, it is sometimes formed of a polymeric material, such as epoxy, polyimide or silicone rubber. Further, the ceramic materials formed, for example, by flame spraying can include alumina, alumina nitride and PBN (Pyrolitic Boron Nitride). Further, FIG. 14 shows a structure in which shielding is provided using the ground base 36 and the insulation cover 37 in order that the RF power passes through the lateral side of the sample table 5 to the plasmas. Further, the susceptor is generally made of a material, such as quartz or alumina, so that it covers an electrode portion of the sample table, except for the surface where the sample is mounted, to prevent plasma-induced injury.

FIG. 15 is a view showing a substrate bias circuit (equivalent circuit), including a surface of the susceptor. The output from the substrate bias power source 11 is mixed with a DC voltage for electrostatic attraction, which is supplied from an electrostatic attraction power source in an impedance matching box (MB) 32 and then supplied to the sample table 5. In this case, radio frequency waves from the substrate bias power source 11 are supplied also to the upper surface of the susceptor, while passing from the sample table 5 to the susceptor 34. The susceptor 34 forms, in this embodiment, a capacitor using the susceptor material as a dielectric material. The thus formed capacitor is represented as a capacitor C (33) in FIG. 15.

The present inventors, at first, experimentally examined adhesion of the deposits when the susceptor thickness was set to 5 mm, as shown in FIG. 14. As a result, it has been found that a great amount of deposits adhered on the upper surface of the susceptor.

Thus, the relation between the thickness of the susceptor 34 and the bias voltage formed on the surface of the susceptor was theoretically examined. The result is shown in FIG. 16. It is known that the adhesion of deposits can be suppressed when the voltage formed on the bell jar inner wall is about 60 V or more. Further, according to the test conducted by the inventors, since the bias voltage (peak-to-peak) Vpp was often set in a range of about 400 to 500 V in the test, the susceptor was selected to have a thickness of 4 mm, so that a voltage of 60 V or higher could be generated on the surface of the susceptor within the range of the bias voltage Vpp.

FIGS. 17 and 18 are views illustrating the adhesion state of deposits to the susceptor of a thin-wall thickness (for example, 4 mm thickness). As shown in FIG. 17, the deposits were examined to determine the adhesion state thereof with the entire thickness of the upper surface of the susceptor being set to 4 mm. As a result, it was confirmed that deposits were not adhered in the range shown by the arrows in the drawing (deposition restriction region). Thus, it was found that adhesion of the deposits could be suppressed for the portion in direct contact with the sample table. However, in the constitution of FIG. 17, since deposits did adhere to the outer circumference of the upper surface of the susceptor, they may hinder the processing since they serve as obstacles on the workpiece.

Thus, the insulation cover 37, which is disposed on the side of the sample table, was removed so that the sample table and the susceptor were in contact with each other entirely over the upper surface of the susceptor and the upper portion of the side of the susceptor. The constitution is shown in FIG. 18. The adhesion state of the deposits was examined experimentally in the same manner as described above by using the structure shown in FIG. 18. As a result, it was found that deposits did not adhere on the upper surface of the susceptor and the upper portion for the side of the susceptor in contact with the sample table. However, it was found that when the susceptor was attached and detached repeatedly, the deposits could not be removed sufficiently even under the same condition. Further, it was found that when the deposits were not removed completely, the deposits were arranged with a localized distribution, and the deposits tended to remain on the surface of the susceptor in particular.

The reason why the deposits were produced with a localized distribution and the deposits could not be removed sufficiently is believed to be as follows. That is, since the susceptor is made of alumina, the thickness is 4 mm, and the dielectric constant is about 8, it corresponds to about 0.5 mm when converted as an air layer. Assuming the gap is 0.1 mm between the susceptor and the sample table, for example, the thickness of the dielectric material forming the capacitor C in FIG. 15 is a total of 0.5 mm for the susceptor and 0.1 mm for the gap, which varies in the range from 0.5 to 0.6 mm (20%). The variation causes localization of the RF voltage generated on the surface of the susceptor, thereby to cause localization in the removal of the deposits. However, it is difficult and not practical to manufacture the susceptor and the sample table such that they are in close contact with an accuracy of the gap of 0.1 mm or less.

In order to overcome the above-mentioned problem, as shown in FIG. 19, a flame sprayed metal film 39 was formed by flame spraying a metal film onto the lower surface of a susceptor 34. Tungsten was used for the flame sprayed metal because it is known that tungsten has a good bondability with alumina. The metal film need not necessarily, be formed of tungsten, so long as the film has an electroconductivity and good bondability with the susceptor, and gold, silver, aluminum or copper may also be used. Further, the method of preparation of the metal film is not necessarily restricted to flame spraying, but any methods capable of forming a thin film, such as plating, sputtering, vapor deposition, printing, coating and adhesion of a thin film, may also be used. When this structure is adopted, since the same voltage as that for the sample table is generated for the entire metal film, so long as the metal film and the sample table 5 are in contact with each other at one position, the problem caused by the gap between the susceptor and the sample table can be avoided.

As a result of examining the adhesion state of the deposits by an experiment using an apparatus having the constitution shown in FIG. 19, it was found that adhesion of deposits in the deposition restriction region shown by arrows in the figure could be eliminated with good reproducibility. The advantage of this method is that the same voltage as that for the sample table 5 is generated over the entire metal film, so long as the metal film and the sample table are in contact with each other at least at one point, to generate a uniform RF voltage on the surface of the susceptor 34. Accordingly, as shown in FIG. 20, even in a state where other structures, such as the insulation cover 37, are present, a uniform RF voltage can be generated on the surface of the susceptor for any range by extending the flame spraying range of the flame sprayed metal film. In the constitution shown in FIG. 20, it was experimentally confirmed that adhesion of the deposits could be eliminated with good reproducibility in the deposition restriction region shown by arrows in the figure.

From the results described above, it has been found that the RF voltage can be generated uniformly on the surface of the susceptor to make the restriction for the adhesion of the deposits uniform by using a metal film formed by flame spraying. By the use of this technique, also in a case where the thickness of the susceptor has to be increased in view of the structure, the same effect can be obtained by embedding the metal film in the susceptor. FIGS. 21 and 22 show examples of such structure.

As shown in the drawings, a flame sprayed metal film 39 is embedded at a position having a predetermined depth from the surface of the susceptor 34 (about 4 mm in the drawing), a contact is led from the flame sprayed metal film 39 to the sample table 5 to ensure good electrical conduction, and the same RF voltage as that for the sample table 5 is applied to the flame sprayed metal film 39.

The sample table for supporting the sample 13 can include, in addition to those types which employ an electrostatic attraction film on the metal sample table, for example, by flame spraying, those types in which a metal electrode is embedded into a sample table made of ceramic dielectrics, such as aluminum nitride or alumina, and electrostatic attraction or an RF bias is created by the metal electrode. Also, in the case of a substrate of this type, it is possible to manufacture a susceptor having quite the same function by forming a metal film on the susceptor.

FIGS. 23 and 24 show example of the features described above. FIG. 23 shows a case of forming a metal film on the rear face of the susceptor 34. An electrostatically attracting and RF bias applying electrode 40, which is made of tungsten, is embedded in a sample table 5 that is made of aluminum nitride. Conduction patterns (flange conduction patterns 41, 42, 43) are embedded from the electrode to the flame sprayed metal film 39 to provide an electrical conduction between the electrode 40 and the flame sprayed film 39. This can supply the same RF voltage as that for the tungsten electrode to the flame sprayed metal film 39 at the rear face of the susceptor. Naturally, the deposition restriction performance of the deposits to the surface of the susceptor by the structure is quite the same as that described previously.

FIG. 24 shows an example of embedding a flame sprayed metal film 39 in the inside of a susceptor 34, in which quite the same effect can be provided in function as in the embodiment of FIG. 23 by extending the conduction patterns described for FIG. 23 (flange conduction patterns 41, 42, 43) and connecting the electrode 40, that is embedded in the sample table 5, to the flame sprayed metal film 39, that is embedded in the susceptor 34 by contact.

In the case of the placing electrode of the sample table 5 shown in FIG. 23 or FIG. 24, it is necessary to prepare a pattern for supplying radio frequency waves from the electrostatically attracting and RF bias applying electrode 40 that is embedded in the table 5 to the flame sprayed metal film 39, and FIG. 25 shows such an example.

In FIG. 25, a flange conduction pattern 41, that is disposed in parallel with the electrostatically attracting and RF bias applying electrode 40, which is made of tungsten, is formed by embedding a tungsten thin film like the tungsten electrode in the placing electrode. The embedded tungsten thin films can be connected with each other by extending them through a hole at a necessary portion after forming the placing electrode and brazing a perforation terminal.

With the method of bias application to the susceptor described so far, adhesion of deposits on the upper surface of the susceptor are just suppressed when the RF voltage for the sample table is at a certain value (400 V in this embodiment). However, if the voltage for the sample table is higher, the RF voltage on the surface of the susceptor is increased excessively, resulting in a problem in that the susceptor is scraped, thereby to shorten the life of the part. This drawback can be overcome as shown in FIG. 26 by using means for controlling the RF bias voltage applied to the surface of the susceptor from the outside. FIG. 26 shows a circuit for controlling the voltage for the susceptor metal film by use of a variable capacitor VC attached externally. FIG. 27 shows the actual structure thereof.

A ceramic cover 50 is formed, for example, by flame spraying on the surface of the sample table at a portion in contact with the susceptor, such that the susceptor flame sprayed metal film 51 and the sample table 5 are not in direct contact with each other. The ceramic cover 50 has a function of forming a capacitor C', as shown in FIG. 26, and transmitting a portion of the RF voltage applied to the sample table 5 to the susceptor flame sprayed metal film 51. Then, the RF voltage applied to the sample table 5 is transmitted to the susceptor flame sprayed metal film 51 by another external variable capacitor VC. Since the RF voltages transmitted by the two capacitors are at the same phase, they are simply added, and an RF voltage generated on the surface of the susceptor is determined depending on the voltage. For example, assuming that the susceptor thickness is 4 mm, the surface area of the susceptor flame sprayed metal film is 400 cm$^2$, the thickness of the ceramic cover made of alumina is 300 μm and the maximum capacitance of the variable capacitor VC is 8000 pF, the voltage on the surface of the susceptor is variable within a range from about 30 to 100 V by varying the capacitance of the variable capacitor VC at a bias RF voltage of the sample table of 400 V. As described above, proper selection of the susceptor thickness, the ceramic cover, the surface area of the flame sprayed metal film and the variable capacitor VC makes it possible to control the RF voltage generated on the surface of the susceptor. Further, although not illustrated, the susceptor flame sprayed metal film may also be incorporated inside of the susceptor, so long as this film can be connected with the variable capacitor VC.

It is also possible to make the bias voltage applied to the susceptor variable by using a RF power source separate from the RF power source used for supplying RF power to the sample table, as is shown in FIG. 28. In this embodiment, a susceptor bias power source 11a for supplying the RF power to the susceptor metal film is provided separately from the substrate bias power source 11 for supplying bias to the sample table. FIG. 29 shows an example of the electrode structure in this case. It is important that insulation and a grounding shield (grounding base 36) are incorporated between the sample table 5 and the susceptor flame sprayed metal film 51, such that the RF voltage applied to the susceptor flame sprayed metal film 51 undergoes no effect by the RF voltage. With this constitution, although there is the drawback of requiring provision of the susceptor bias power source 11a, the bias applied to the susceptor can be controlled quite independently of the RF voltage applied to the sample 13. Further, the susceptor flame sprayed metal film 51 in this embodiment can be incorporated inside of the susceptor, although this is not illustrated, so long as it can be connected with the susceptor bias power source 11a.

FIG. 30 is a graph illustrating the method of optimizing the susceptor bias voltage. Like the FSV described previously, there also exists an optimal value for the susceptor bias voltage. The voltage is influenced by the frequency of the bias power source, the material and the thickness of the susceptor, the plasma density, the plasma composition, the constitution for the entire vacuum reactor, and the material, processing rate and processing area of the sample. Accordingly, the optimal voltage of the susceptor bias voltage has to be changed for every process. Similar to the embodiment of FIG. 3, light emission from the susceptor material is increased as the susceptor bias voltage is increased beginning at a certain value of the susceptor bias voltage (point b in FIG. 3) as a boundary. It shows that the susceptor bias voltage at the point b or lower is associated with the state where deposits are deposited on the susceptor, while the susceptor bias voltage at the point b or higher is associated with the state where the deposits are sputtered and not deposited, and the susceptor material itself is sputtered as well.

While the optimal voltage for the susceptor bias voltage is at the point b, the point a is sometimes determined as the optimal value depending on the process. For example, this corresponds to a case in which the processing reaction for the workpiece or the reaction in the gas phase is different from intended conditions due to the release of material into the gas phase by the sputtering onto the material of the susceptor, with the result that the desired process can not be executed. That is, by setting the susceptor bias voltage to the point a, deposition of deposits is allowed, though slightly, to the susceptor material, so that the susceptor material is not sputtered at all. This can prevent processing problems caused by the release of the susceptor material. Instead, it is necessary to conduct cleaning for the susceptor by a process used exclusively for cleaning (in which the susceptor bias voltage is set higher than the point b) before substantial deposition of deposits occurs on the susceptor.

On the contrary, the desired process sometimes can not be conducted stably when deposits are deposited, even if they are little, on the susceptor due to generation of obstacles or the like. In this case, the optimal susceptor bias voltage is set to the point c, and the condition can be set such that the susceptor may be scraped to some extent, but reaction products are not deposited at all. In this case, a drawback results in that the susceptor is consumed greatly, but it can provide an advantage in that the frequency of cleaning of the susceptor can be decreased.

On the contrary, there is a case where the desired process can not be conducted stably when deposits have adhered, even by a little amount, on the susceptor due to the occurrence of obstacles and the like. In this case, it is possible to set the optimal point of the susceptor bias voltage to point c and to set such conditions that the susceptor may be allowed to be scraped somewhat, but deposits are not deposited at all. In this case, a drawback of increasing the susceptor consumption is present, but it can provide the advantage of reducing the frequency of susceptor cleaning.

The susceptor bias voltage is set to the point b in a case where neither the scraping of the susceptor, nor the adhesion of the reaction products, is desirable. In this case, it is important to improve the reproducibility of the bias setting voltage of the susceptor. This is because a change with lapse of time has to be suppressed in the case of conducting the same process in a different apparatus or conducting the same process continuously even in the same apparatus. For this purpose, feedback control for the susceptor bias voltage is important.

FIGS. 31 and 32 show susceptor bias application circuits, each with a feed back control circuit corresponding, respectively, to FIGS. 26 to 28. In both of the circuits, the voltage for the susceptor flame sprayed metal film is detected by way of an attenuator and filter 52 and then converted into a dc voltage. Thus, a DC voltage signal is produced in proportion to the susceptor bias voltage. The signal is compared with a preset value set by the recipe of the main body apparatus control section 57 or the setting value to control a motor for rotating a variable capacitor VC that determines the susceptor bias voltage in the case of FIG. 31. Further, the output of the susceptor bias power source 11a is controlled in the case of FIG. 32. By using this method, the susceptor bias voltage can be controlled to a value set in the main body apparatus, and the value of the susceptor bias voltage can be controlled at a constant level in the case of processing by the same process in a different apparatus or in the same apparatus continuously, so as to suppress the difference between the apparatuses and the change with time.

Methods and structures for the region to control, such that deposits are not formed or adhered, that is, the bell jar 12, the gas blowing port 23 and the susceptor 34, have been described above. So long as the reaction products from the sample 13 or the materials synthesized in the gas phase are volatile ingredients of high vapor pressure, the materials are exhausted by the exhaustion device from the discharging portion or the periphery of the materials to be processed, and most of them are exhausted, although they are deposited to some extant on a lower portion of the electrode or the exhaustion duct.

However, when highly depositing materials, that is, materials having a low vapor pressure and adhesion coefficient to a solid of about 1 (almost captured when in contact with a solid) are formed as reaction products from the sample or are synthesized in the gas phase, the materials are deposited on the bell jar, the susceptor disposed at the periphery of the sample or the vacuum reactor wall, including the gas blowing port, and are scarcely exhausted.

In the situation described above, when control is affected such that deposits do not adhere to any portion in the vacuum reactor, such highly depositing materials have no place for deposition. Accordingly, the density of the highly depositing material in the gas phase is increased to increase the depositing motive force, and, as a result, they are compulsorily deposited on the bell jar or the susceptor.

That is, such control to prevent the deposits from adhering on the bell jar or the susceptor can be attained by providing a place for depositing a great amount of the deposits. Then, by increasing the amount of deposits that can be deposited, or rapidly depositing them from the gas phase, the performance for controlling the amount of deposits on the bell jar or the susceptor can be enhanced.

That is, it is necessary to provide a region for depositing deposits rapidly and in a great amount from the gas phase (deposition trap region) near the periphery of the workpiece where highly depositing reaction products are formed, or at the periphery of plasma regions. The deposition preventive plate functions as a cover for suppressing the adhesion of deposits to the gas blowing port, since it is a premise that deposits are deposited to the preventive plate itself, and this is also a sort of traps.

FIG. 33 shows the inside of a vacuum reactor which is divided into regions including deposit traps. The bell jar region and the wafer (sample)/susceptor region are regions controlled so that deposits do not adhere therein. All other regions in contact with the plasmas are deposition trap regions, of which deposition trap region ① is a region including the deposition preventive plate and a lower portion of the gar ring. The region ① can be directly observed (viewed) from the wafer. The bell jar region, the wafer/susceptor region and the deposition trap region ① constitute all the regions that can be observed (viewed) directly from the wafer, which are regions for generating plasmas and also regions where highly depositing materials formed from the wafer in plasma gas phase are most likely to adhere. When the deposits are deposited in the regions that are in a not controlled state, they cause obstacles on the wafer or vary the plasmas with time. Accordingly, in the region that can be observed directly from the wafer, adhesion of the deposits has to be controlled as completely as possible.

In accordance with the invention, in the case of using the structure shown in FIGS. 12 and 13 for the deposition preventive plate, 100% of the regions that can be observed from the wafer are in the deposition-controlled state. Further, in the case of using the structures shown in FIG. 6, FIG. 9, FIG. 11, it is necessary that 90% or more of the surface area of the regions that can be observed from the wafer is in the deposition-controlled state.

Further, since the suppressing function of the bell jar region or the wafer/susceptor region can be enhanced when the deposition trap region provides a sufficient function as described above, it is preferred that the surface areas for the bell jar region and the susceptor region are as small as possible, and the surface area for the deposition trap region ① is as large as possible. In a case where highly depositing reaction products are formed from the wafer, it has been found by an experiment conducted by the inventors that the deposition suppressing function in the bell jar region and the wafer/susceptor region is lowered when the surface area S1 for the deposition trap region ① is defined as: $S1 < 0.55\ SW$ (where SW is a wafer surface area). Accordingly, to rapidly deposit the reaction products in the deposition trap, a relation is defined as: $S1 \geq 0.5 \geq S1$ and, preferably as: $S1 \geq S1$.

The deposition trap region ② is referred to as a ring cover, which is present below the deposition trap region ①. While the region can not be observed directly from the wafer, highly depositing materials are transported through diffusion, and a great amount of deposits adhere on the upper surface thereof.

The deposition trap region ③ is a side cover for the electrode, which can not be observed directly from the wafer, but a great amount of deposits adhere to the upper portion thereof, like the deposition trap region ②. Since the deposition trap regions ② and ③ are not directly observed from the wafer, there is less possibility that the deposits which adhere thereto form obstacles to the wafer or cause a change with time in the plasmas. However, the deposition traps are important in order to conduct the cleaning operation efficiently, when the apparatus is opened to atmospheric air. That is, since the reaction products are highly depositing, 90% or more of them can be adhered to and recovered from the deposition trap regions ①, ② and ③. Accordingly, the inside of the vacuum reactor can be cleaned efficiently by arranging each of the deposition trap regions ①, ② and ③ into a swap kit (made exchangeable) and being entirely replacing them with already cleaned parts after opening the apparatus to the atmospheric air. For this purpose, there are two necessary conditions. One is that the deposit trap be light in weight, and the other is that it be easy to detach/attach. To reduce the weight of the trap, it is important that the material for the deposition trap be made of a light weight material, for example, aluminum.

After opening the apparatus to the atmospheric air, the deposition traps are detached successively in the order of ①, ② and ③ from the vacuum reactor and a minimal required cleaning operation is conducted. The minimal required cleaning place is, for example, the periphery of the opening for wafer transportation. Then, swap kits for the deposition traps, after cleaning, are attached in the order opposite to the above, and the evacuation can be conducted immediately. As a result, the cleaning operation can be performed in a minimal time. The cleaning operation according to the procedures described above can not only shorten the cleaning time, but also shorten the time required for evacuation. This is because moisture in the atmospheric air adsorbed onto parts in the non-vacuum state can be minimized by opening the reactor to the atmospheric air only for the minimal required time, and the amount of solvent remaining in the vacuum reactor can be minimized by using a minimal amount of cleaning solvent (pure water or alcohol). After cleaning, the detached deposition traps ①, ② and ③ are cleaned and then utilized again as the swap kits for atmospheric opening/cleaning operation at the next time. The regions to be arranged into the swap kits as the deposition traps are not necessarily restricted only to the regions shown in FIG. 33. While differing depending on the process or the material to be handled, it is effective to make the all of the regions in which deposits adhere as the deposition traps. For example, in a case where deposits are adhere only in one-half or more of the regions of the electrode cover, the upper-half of the electrode cover is arranged into a swap kit. On the contrary, under the conditions where the deposits adhere as far as the exhaustion duct, it is effective to also arrange the inner wall of the exhaustion duct as a deposition trap region and arrange the same into a swap kit.

As has been described above, according to the present invention, since the films that are deposited on the inner wall of the vacuum reactor are controlled, it is possible to provide a plasma processing apparatus and a plasma processing method that have a satisfactory mass production stability.

While the invention has been described with reference to its preferred embodiments, it is to be understood that the words which have been used are words of description rather than limitation and that changes within the purview of the appended claims may be made without departing from the true scope and spirit of the invention.

What is claimed is:

1. A plasma processing apparatus for processing a sample which is located in a processing chamber disposed inside a vacuum vessel using a plasma generated in the processing chamber comprising:
    a sample stage disposed at a lower portion of the processing chamber on which the sample is located, the processing chamber including a plasma region above the sample stage;
    a bell jar made of an insulative material constituting an upper portion of the vacuum vessel which is disposed above the sample stage and at an upper portion of the processing chamber, the processing chamber being surrounded by the bell jar and the vacuum vessel;
    a coil antenna disposed outside of and around the bell jar to which electric power is supplied to generate an induction-type plasma in a plasma generating space inside of the bell jar;
    a Faraday shield mounted above the bell jar and disposed so as to overlap the bell jar between an external surface of the bell jar and the coil antenna, the Faraday shield being supplied with radio frequency power;
    a ring portion of the vacuum vessel being located below a skirt portion of the bell jar and being disposed above and surrounding the sample stage, the ring portion constituting a part of the upper portion of the vacuum vessel; and
    a plate member which is disposed in the processing chamber between an inner surface of the skirt of the bell jar and the plasma region, the plate member having a first part which is spaced from and covering a portion of an area of the inner surface of the skirt portion of the bell jar, the skirt portion of the bell jar being spaced from a lower end of the Faraday shield, the plate member being configured to be detachably disposed with respect to the inside of the vacuum vessel, the first part of the plate member being configured to cover the portion of the area of the inner surface of the bell jar extending from at least a lower end of the inner surface of the bell jar to an area above the lower end of the inner surface of the bell jar inside of the vacuum vessel.

2. A plasma processing apparatus according to claim 1, wherein the Faraday shield is mounted above an outer surface of the bell jar so as to be spaced a first distance from the outer surface of the bell jar, and an outer peripheral portion of the Faraday shield is disposed with respect to an outer surface of the skirt portion of the bell jar so as to be spaced therefrom at a distance which is larger than the first distance.

3. A plasma processing apparatus according to claim 1, wherein the plate member is made of an electric conductive material and is connected to ground, and a second part of the plate member is configured so as to be spaced from and cover an inner surface of the ring portion of the vacuum vessel and a boundary between an upper end portion of the ring portion of the vacuum vessel and the lower end of the inner surface of the bell jar.

4. The plasma processing apparatus according to claim 3, wherein at least one of the first part and the second part of the plate member is spaced from at least one of the inner surface of the bell jar and the inner surface of the ring portion by a gap in a range of 5 mm to 15 mm.

* * * * *